(12) United States Patent
Lin et al.

(10) Patent No.: US 8,163,381 B2
(45) Date of Patent: *Apr. 24, 2012

(54) MULTI-LAYER CHIP CARRIER AND PROCESS FOR MAKING

(75) Inventors: Pui-Yan Lin, Hockessin, DE (US);
Govindasamy Paramasivam Rajendran, Garnet Valley, PA (US);
George Elias Zahr, Glen Mills, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 763 days.

This patent is subject to a terminal disclaimer.

(21) Appl. No.: 12/256,665

(22) Filed: Oct. 23, 2008

(65) Prior Publication Data

US 2010/0065314 A1 Mar. 18, 2010

Related U.S. Application Data

(60) Provisional application No. 60/983,060, filed on Oct. 26, 2007.

(51) Int. Cl.
*H05K 1/02* (2006.01)

(52) U.S. Cl. ........ 428/323; 428/209; 428/407; 428/414; 428/415; 428/418; 174/250; 174/258; 174/259; 361/762; 361/765

(58) Field of Classification Search .......... 174/250–259; 428/209, 325, 323, 407, 414, 415, 418; 361/762, 361/765

See application file for complete search history.

(56) References Cited

U.S. PATENT DOCUMENTS

| 4,798,762 | A | * | 1/1989 | Okada et al. | 428/300.7 |
| 4,997,863 | A | * | 3/1991 | Ogitani et al. | 523/220 |
| 5,834,101 | A | | 11/1998 | Hayashi | |
| 6,359,235 | B1 | * | 3/2002 | Hayashi | 174/260 |
| 6,376,053 | B1 | | 4/2002 | Nakamura et al. | |
| 6,500,529 | B1 | * | 12/2002 | McCarthy et al. | 428/209 |
| 6,618,238 | B2 | * | 9/2003 | Sanville, Jr. | 361/323 |
| 6,855,892 | B2 | * | 2/2005 | Komatsu et al. | 174/256 |
| 7,179,552 | B2 | | 2/2007 | Nakamura et al. | |
| 7,208,062 | B2 | | 4/2007 | Nakamura et al. | |
| 7,473,853 | B2 | * | 1/2009 | Murai et al. | 174/260 |
| 7,658,988 | B2 | * | 2/2010 | Lin et al. | 428/209 |
| 7,829,188 | B2 | * | 11/2010 | Lin et al. | 428/331 |
| 2005/0186434 | A1 | | 8/2005 | Nakamura et al. | |

FOREIGN PATENT DOCUMENTS

| DE | 10161101 A1 | 3/2003 |
| EP | 1583405 A | 10/2005 |
| JP | 2006051469 | 2/2006 |
| JP | 2006179888 | 7/2006 |

OTHER PUBLICATIONS

Epoxy Resins, Kirk-Othmer Encyclopedia of Chemical Technology, 2007, vol. 10:347-471.
English Abstract for DE10161101, ESP@CENET.COM

* cited by examiner

*Primary Examiner* — Cathy Lam

(57) ABSTRACT

Provided, are multi-layer chip carriers comprising an asymmetric cross-linked polymeric dielectric film, and processes for making the chip carriers.

8 Claims, 14 Drawing Sheets

Step A

Steps B, C

Steps D, E

Step F

Continue to Fig. 3E

Continued from Fig. 3D
↓ Step G

↓ Step H

↓
For additional layers, repeat Steps A thru H

Step J

Steps K, L

Steps M, N

Step O, P

Continue to Fig. 4E

Step Q

Step R

Step S

Continue to Fig. 4H

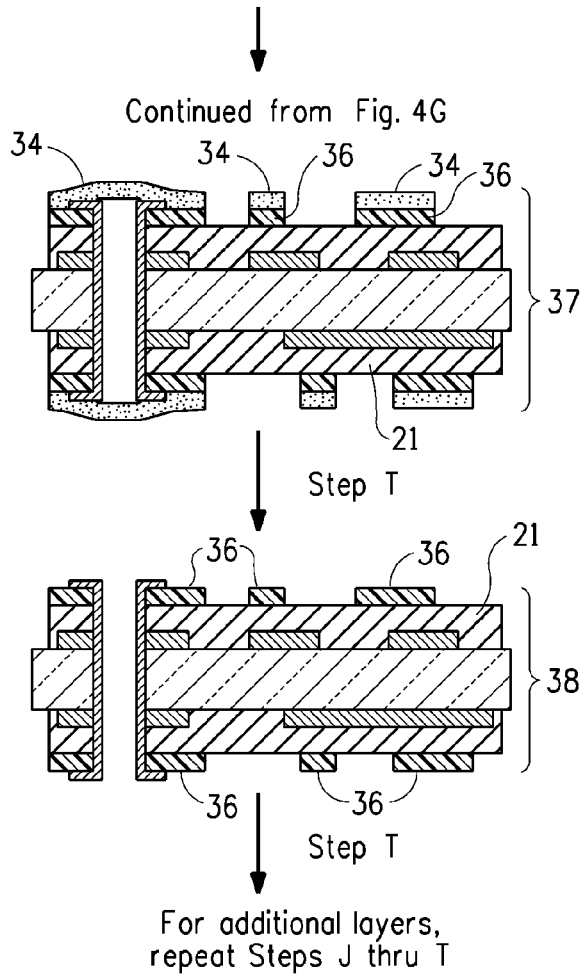
FIG. 4H
FIG. 4I
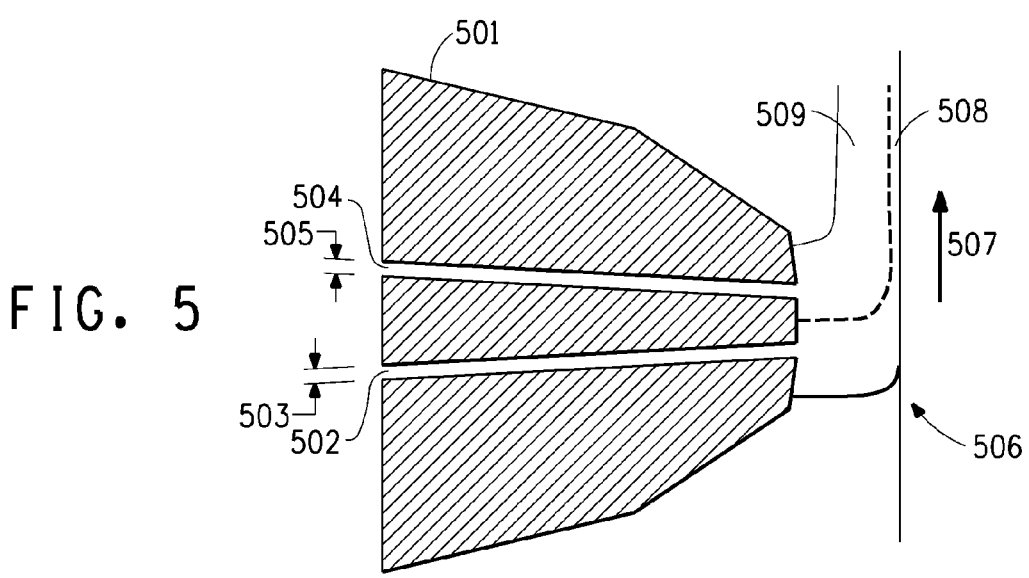
FIG. 5

MULTI-LAYER CHIP CARRIER AND PROCESS FOR MAKING

FIELD OF THE INVENTION

The present invention is directed to multi-layer chip carriers comprising an asymmetric cross-linked polymeric dielectric film, and processes for making the chip carriers.

BACKGROUND

Shibagaki et al., Japanese Patent Publication 2006179888A, discloses a two layer interlayer film for a chip carrier. A high viscosity layer of curable resin composition containing 5-45% inorganic filler and a low viscosity layer curable resin composition containing 35-75% inorganic filler are disclosed.

Mizukai et al., Japanese Patent Publication 2006051469, discloses a dry resist photosensitive material manufacturing method that manufactures a dry resist photosensitive material having multiple photosensitive layers formed on a support, characterized by the fact that the 2 or more photosensitive layers are formed at the same time by coating two or more kinds of coating solutions on a support by using a simultaneous multi-layer coating apparatus at the same time, followed by drying.

Nakamura et al., U.S. Pat. No. 6,376,053, discloses an interlaminar adhesive film for chip carriers, the adhesive film having at least two layers, and a method for preparing multi-layer chip carriers.

A multi-layer chip carrier typical of the art is shown schematically in FIG. 1. A multi-layer chip carrier, 100, typically includes a core layer, 102, often but not necessarily an epoxy-fiberglass composite, upon which are adheringly disposed several discrete conductive pathways, 103, to form a first layer. The conductive pathways, 103, and the substrate surface between conductive pathways, 104, are completely encapsulated by a two layer dielectric build-up layer, 105a and 105b, Disposed upon the top surface of the dielectric build-up layer, 105b, is a second layer of conductive pathways, 106. Also shown in FIG. 1 is a conductive via, 107, connecting a conductive pathway in the first layer to a conductive pathway in the second layer. The purpose of the structure, 100, is to provide circuitry for one or more integrated circuit chips, 108, mounted on the chip carrier. In common commercial use, the two layer dielectric build-up layer depicted in FIG. 1 is replaced by a single homogeneous layer.

The dielectric build-up layer, 105a and 105b, in a multi-layer chip carrier, 100, performs several functions. When the dielectric build-up layer is a two layer structure as depicted in FIG. 1, the bottom portion of the dielectric build-up layer, 105a, adheringly conforms to the discrete conductive pathways, 103, and the substrate surface between them, 104, with a low coefficient of thermal expansion in order to avoid delamination during processing. The top surface of the upper portion of the dielectric build-up layer, 105b, provides a high level of adhesion for the second layer of conductive pathways, 106. Low coefficient of thermal expansion (CTE) is desired.

The bottom portion, 105a, is formable during preparation in order to completely encapsulate the substrate surface, 104, and the first layer of conductive pathways, 103. However, after encapsulation the dielectric build-up layer exhibits a low coefficient of thermal expansion in order to prevent delamination. This is generally accomplished in the art by employing a curable resin for the dielectric build-up layer.

The direction of the electronics industry is to ever smaller circuit components. Reduction in the spacing intervals and size of the conductive pathways places ever greater demands on the coefficient of thermal expansion of the dielectric build-up layer in order to prevent delamination. In typical commercial practice, the surface of the dielectric build-up material is roughened in preparation for deposition of the next layer of conductive material. If the surface features of the roughened material are large enough, they will lead to excessive non-uniformity in the geometry of the next layer of conductive pathways resulting in impedance variations that degrade the processability of high frequency signals.

Lower CTE can be achieved by increasing the filler content. But higher filler content can lead to a higher surface roughness. Nakamura et al. address this problem by using a two-layer film. However, the interface between the layers can be a locus of stress concentration with possible delamination. In addition, the production cost for a multilayer dielectric build-up layer according to the method of the art is high.

SUMMARY OF THE INVENTION

One aspect of the present invention is a multi-layer chip carrier comprising a dielectric substrate having a surface, a first electrically conductive layer adheringly disposed upon at least a portion of the surface of the dielectric substrate, and an asymmetric film having a first film surface and a second film surface, said first film surface and said second film surface parallel to one another and separated by an interior, the film comprising a thermoset resin composition with one or more fillers dispersed therewithin, the one or more fillers having a total concentration of 15% to 75% by weight based on the total combined weight of the thermoset resin composition and fillers when cured, excluding solvents and volatiles, wherein in the interior the concentration of the one or more fillers exhibits a continuous gradient, each of the fillers having an average particle size in the range of 0.01 to 5 micrometers (μm); the first surface being in conforming contact with the first electrically conductive layer, and the second surface being in adhering contact with a second electrically conductive layer disposed thereon.

Another aspect of the invention is a process comprising: conformably laminating an uncured formable asymmetric thermoset film to a circuitized dielectric core to form a laminated circuitized dielectric core comprising an uncured laminated asymmetric thermoset film, the asymmetric thermoset film having a first film surface and a second film surface, the surfaces being parallel to one another and separated by an interior, the film comprising an uncured thermoset resin composition with one or more fillers dispersed therewithin, the one or more fillers having a total concentration of 15% to 75% by weight based on the total combined weight of the thermoset resin composition and fillers when cured, excluding solvents and volatiles, wherein in the interior the concentration of the one or more fillers exhibits a continuous gradient; each the one or more fillers having an average particle size in the range of 0.01 to 5 micrometers (μm); the second surface being in conforming contact with the circuitized dielectric core layer;

thermally curing the uncured laminated asymmetric thermoset film to form a cured laminated circuitized dielectric core;

introducing vias, through-holes, and semi-through holes in the laminated circuitized dielectric core;

roughening the exposed surfaces in the laminated circuitized dielectric core with chemical desmearing agents;

adheringly applying a metallic layer to the first surface of the asymmetric film;

covering at least a portion of the exposed metallic layer with a photoresist surface;

imagewise exposing the photoresist surface, and developing the photoresist to form a pattern upon the imagewise exposed photoresist coating;

increasing the thickness of the exposed metallic layer using means such as electrolytic deposition;

removing the residual photoresist surface; and etching the patterned surface to remove unwanted conductive material to produce a pattern of discrete conductive pathways thereupon.

BRIEF DESCRIPTION OF THE DRAWINGS

FIG. 5 shows in schematic form an embodiment of the process of the invention.

DETAILED DESCRIPTION

Figure 1:
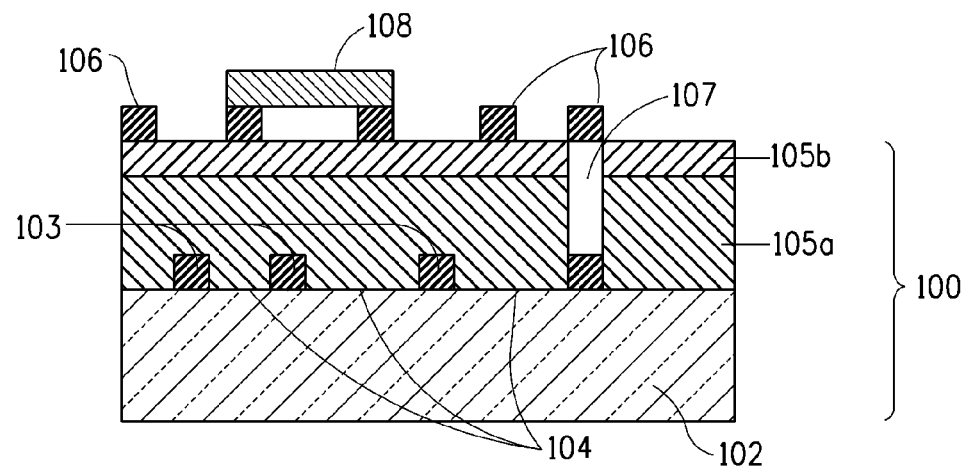
FIG. 1 shows in schematic form a typical multi-layer chip carrier of the art.

Thermoset resins are in broad commercial use and are well-known in the art. See for example, *Handbook of Thermoset Plastics*, Sidney H. Goodman, ed., Noyes Publications (1999). Epoxy chemistry is well known in the art. See, for example, *Handbook of Epoxy Resins* by Henry Lee, McGraw-Hill (1982); or "Epoxy Resins" in Kirk-Othmer Encyclopedia of Chemical Technology, Vol. 10, p 347 if, John Wiley (2007).

As used herein, the term "thermoset resin" refers to a composition comprising a thermoset having cross-linkable functional groups, a cross-linking agent, if any, also referred to as a "curing agent," reactive with the cross-linkable functional groups of the thermoset resin, and a toughening agent, if any, or to the cross-linked reaction product. The term "thermoset resin composition" refers to a composition comprising the thermoset resin as defined supra, a catalyst, if any, and any other such additives (not including fillers) commonly employed in the art as additives to thermoset resins with the proviso that maintaining a uniform dielectric constant is important for practical reasons.

The degree of curing of a thermoset refers to the percentage of available cross-linkable functionality that has in fact undergone cross-linking. Herein, the term "uncured thermoset resin" is a functional term. The uncured thermoset resin as employed herein is a shape-retaining solid that is highly soluble in common solvents, and is readily deformed when subject to pressure, with or without heat. It has been observed in the practice of the invention that certain epoxy compositions can be as much as 60% cured and still be formable according to a process of the present invention.

The term "cured thermoset resin" refers to a composition wherein at least 90% of the cross-linkable functional groups have undergone cross-linking. The term "curing" refers to the process by which the cross-linking or curing agent reacts with the cross-linkable functional groups to form the cross-linked network characteristic of a cured thermoset resin. The cured thermoset resin as employed herein is a non-deformable solid exhibiting limited or no solubility in conventional solvents. "When cured", as used herein with reference to the thermoset resin compositions as a basis for weight fractions of, for example, fillers, means that portion of the thermoset resin composition remaining in solid form after curing, which excludes solvents, volatiles, and volatile reaction components that may be generated during curing. Reaction products are only generated during curing, and not after, since any reaction will have been completed when curing is done.

As used herein, the terms "filler" and "inorganic filler" are synonymous. They are employed herein to refer to particulate inorganic matter as described, infra.

The present invention provides an asymmetric film having a first film surface and a second film surface, the surfaces being parallel to one another and separated by an interior, the film comprising an uncured thermoset resin with one or more fillers dispersed therewithin, the one or more fillers in a total concentration of 15% to 75% by weight based on the total combined weight of the cured thermoset composition (excluding solvents and volatiles), wherein the interior the concentration of the one or more fillers exhibits a continuous gradient; each the one or more fillers having an average particle size in the range of 0.01 to 5 micrometers (μm).

In one embodiment, the asymmetric film further comprises a resin-rich region proximate to the first film surface. In a further embodiment, the asymmetric film further comprises a filler-rich region proximate to the second film surface.

"Resin rich" means a region of the film where the concentration of resin is higher on a weight basis than it is in other regions of the film. Similarly, "filler rich" means there is a higher concentration of filler on a weight basis than in other regions of the film. This can be seen in the TEM photos where proximate to one surface (designated the "first surface") there is a relatively higher concentration of resin (and lower concentration of filler) than in the remaining film.

In a further embodiment, the asymmetric film further comprises a resin-rich region proximate to the first surface, a filler-rich region proximate to the second surface, wherein the transition region between the resin-rich and filler-rich regions wherein the concentration of the one or more fillers exhibits a continuous gradient.

As used herein, the term "asymmetric film" refers to a film having a first surface and a second surface parallel to the first surface and separated therefrom by an interior, the film comprising a cured or uncured thermoset resin, and a filler, the filler being distributed in the interior in a continuous but asymmetric manner between the surfaces—that is the filler distribution has a non-zero continuous concentration gradient from one the surface to the other. In one embodiment, the concentration gradient can be manifested as a relatively filler-rich region proximate to one the surface and a relatively resin-rich region proximate to the other the surface with a continuous filler distribution between the regions. In another embodiment the concentration gradient can also be manifested, in the case when two fillers are employed, as described infra, as a region relatively rich in one filler proximate to one the surface and a region relatively rich in the other filler proximate to the other the surface. Both the manifestations of a concentration gradient can be present at once.

For use as a build-up dielectric in electronic chip carriers, suitable thermoset resin compositions comprise multifunctional thermoset resins exhibiting glass transition temperature ($T_g$) $\geq$ 140° C. and moisture uptake of 5 weight % or less, preferably 2% or less as determined according to Japanese Industrial Standard JIS C6481.

Suitable thermoset resins include those that, in the uncured or partially cured state, either with or without solvents, have solution viscosities of $10^{-3}$ to 10 Pa·s. Preferred are resins that have cure initiation temperatures of >50° C., more preferably >90° C. Preferred are resins suitable for electronic applications, having Tg $\geq$ 140° C. in the cured state, moisture uptake of 5 weight % or less, preferred 2% or less in the cured state according to Japanese Industrial Standard JIS C6481, and with dielectric constant less than 5 at 1 GHz. Preferred are thermosets that do not generate volatile reaction products. Suitable resins include but are not limited to epoxies, cyanate esters, bismaleimide-triazine, addition polyimides, unsaturated polyesters, butadiene, copolymers of mono-vinyl aromatic hydrocarbon with conjugated dienes, and combinations such as but not limited to epoxy/cyanate ester, bismaleimide-triazine/epoxy.

Suitable multifunctional epoxies include but are not limited to phenol novolac epoxy, cresol-novolac epoxy, tetraglycidyl ether of diaminodiphenylmethane, triglycidyl tris(hydroxyphenyl) methane, trisphenol epoxy resin, triglycidyl ether of p-aminophenol, naphthalene epoxy resin, the epoxy derivative of triazine, the epoxy derivative of biphenol. Suitable epoxy compositions may further comprise a liquid or low melting point epoxy resin including but not limited to glycidyl ethers of bisphenol A, bisphenol F, and bisphenol S, and reactive diluents such as aliphatic epoxies."

Suitable curing agents include but are not limited to amines, amides, polyamides, polyamine adducts, acid anhydrides, organic acids, phenols and phenolic resins. Phenolic curing agents are particularly preferred for their moderating effects on viscosity of the composition and moderating effect on water uptake. Certain thermoset resins may also be homopolymerized with suitable catalysts such as imidazoles, tertiary amines, dicyandiamide. Suitable phenol curing agents include bisphenol A, xylok type phenol resin, dicyclopentadiene type of phenol, terpene modified phenol resin and polyvinylphenol etc, or a combination of two or more of the above compounds.

The thermoset resin may further comprise a toughening agent such as carboxyl terminated butadiene, phenoxy, polyvinyl acetal, polyamide, polyamidimde, and polybutadiene.

Rheology control of the thermoset resin compositions employed in dielectric build-up layer films is desired such that the resin fills all the space between the micrometer size conductive pathways. Preparation of suitable thermoset resin compositions is described in Published United State Patent Application 200510186434A1, U.S. Pat. No. 7,179,552 B2 and U.S. Pat. No. 7,208,062 B2. It is desired that the extracted film be shape retaining after extraction while still retaining a high degree of formability. This combination of properties can be achieved by combining the thermoset resin composition supra with up to 50% by weight of a polymer.

Suitable polymers include but are not limited to phenoxy resins, polyimide resins, polyamide imide resins, polyether imide resins, polysulfone resins, polyether sulfone resins, polyphenylene ether resins, polycarbonate resins, polyetheretherketone resins, polyester resins and so on, all characterized by a weight average molecular weight in the range of from 5,000 to 100,000. When the weight average molecular weight is less than 5,000, the extracted film may not hold its shape. When the weight average molecular weight exceeds 100,000, the solubility in organic solvents decreases.

Suitable polymers include but are not limited to phenoxy resins such as "Phenototo YP50" (manufactured by Toto Kasei Co., Ltd.), "E-1256" (manufactured by Japan Epoxy Resin Co., Ltd.), brominated phenoxy resins such as "YPB-40-PXM40" (manufactured by Toto Kasei Co., Ltd.) and so on, and phenoxy resins having a bisphenol S skeleton such as "YL6747H30" (Japan Epoxy Resin Co., Ltd., cyclohexanone varnish of a phenoxy resin made of bisphenol A type epoxy resin "Epicoat 828" and bisphenol S: having a nonvolatile component that is 30% by weight and weight average molecular weight of 47,000).

Commercially available epoxy resin compositions suitable for use herein include, but are not limited to, novolac epoxy such as Dow Chemical Co. DEN 431, 438, 439; biphenyl epoxy such as Nippon Kayku Co NC-3000

Suitable fillers have an average particle size determined by light scattering of 0.01 to 5 μm. Suitable fillers include but are not limited to silica, alumina, talc, boron nitride, titanium dioxide, strontium titanate, calcium titanate, zirconia, mullite, cordierite; clays such as mica, bentone, and smectic clays; barium sulfate, barium titanate, and barium zirconate. Preferred are silica and alumina.

In one embodiment of an asymmetric film, a first filler having an average particle size of 0.01 to 0.05 μm is combined with a second filler having an average particle size of 0.1-5 μm. In another embodiment, at least some of the filler particles are surface treated in order to improve dispersion in the epoxy matrix.

In one embodiment, a single filler population is present, as indicated by a single characteristic size distribution curve. In another embodiment a dual filler population is present as indicated by a bimodal characteristic size distribution curve. In the case of a bimodal distribution, characterized by a smaller-size population and a larger-size population, the smaller-size population has an average particle size in the range of 0.01 to 0.05 μm, and the larger size population has a particle size in the range of 0.5 to 5 μm.

The filler particles in the asymmetric film perform two quite different functions. On the one hand, the fillers in the filler-rich region provide reinforcement to the thermoset resin to reduce the coefficient of thermal expansion, minimizing the chance of delamination from the adjacent layer of a chip carrier. On the other hand, fillers proximate to, or at, the surface of the resin-rich region provide a desirable roughening effect during surface etching in preparation for applying a new metallic conductive layer.

In one embodiment, the resin-rich region contains a plurality of finer filler particles than does the filler-rich region. In a further embodiment, the resin-rich region represents 10% or less of the thickness of the asymmetric film.

In one embodiment the asymmetric film comprises a resin-rich region of uniform composition. In a further embodiment, preferred for use as the resin interface in a resin-coated conductive foil, the resin-rich region comprises less than 5 weight-% of a filler. In an alternative embodiment, preferred for use as a surface etchable dielectric build-up layer in preparing multilayer chip carriers, the resin-rich region comprises more than 5 weight-% of a filler but less than 40 weight-%.

In one embodiment the asymmetric film comprises a filler-rich region of uniform composition. In a further embodiment the filler-rich region comprises more than 40 weight-% but less than 80 weight-% of a filler.

In another embodiment the asymmetric film comprises a resin-rich region of uniform composition proximate to the first film surface, the resin-rich region having a filler concentration of 0 to 40 wt-%; a filler-rich region of uniform composition proximate to the second film surface, the filler-rich region having a filler concentration of 40 to 80 wt-%; and a gradient region characterized by a continuous gradient in filler concentration disposed between the resin-rich region and the filler-rich region.

In another embodiment the asymmetric film consists essentially of a resin-rich region of uniform composition proximate to the first film surface and a gradient region proximate to the resin-rich region on one side and the second film surface on the other. In this embodiment, there is no filler-rich region of uniform composition.

In another embodiment the asymmetric film consists essentially of a filler-rich region of uniform composition proximate to the second film surface and a gradient region proximate to the filler-rich region on one side and the first film surface on the other. In this embodiment, there is no resin-rich region of uniform composition.

In another embodiment the asymmetric film consists essentially of a gradient region proximate to both the surfaces. In this embodiment, there is no region of uniform composition proximate to either the surface.

As used herein, the term "region" refers to a portion of the film interior that is oriented longitudinally substantially parallel to the film surface and substantially coextensive therewith.

The disposition of the gradient region with respect to the first and second film surfaces is determined by the thickness of the film and the viscosity of the coating solutions, as described infra. Other factors being equal, films of a thickness of 5 μm or less often exhibit only a gradient region. As the film thickness is increased, regions of uniform composition begin to emerge proximate to one or both the film surfaces.

In a similar fashion, the highest viscosities of the coatings in the process, infra, tend to result in the least extensive gradient regions with thus the highest concentration gradients. At excessively high viscosities, a distinct two-layer film is produced rather than the single layer asymmetric film.

As viscosity is reduced, the gradient region becomes more extensive and the magnitude of the gradient is reduced. At excessively low viscosities, the gradient is reduced to zero and the resulting film is a homogeneously mixed film rather than the asymmetric film.

The asymmetric film can be of any thickness, but it is preferably of a thickness in the range of 5 to 150 μm.

The asymmetric film can be laminated to similar or dissimilar films, sheets, and the like. However, the asymmetric film is itself not a structure having distinct layers. It is a unitary structure characterized by a continuous gradient in filler concentration in the direction normal to the parallel surfaces. One embodiment of the asymmetric film is illustrated schematically in FIG. 2.

Figure 2:
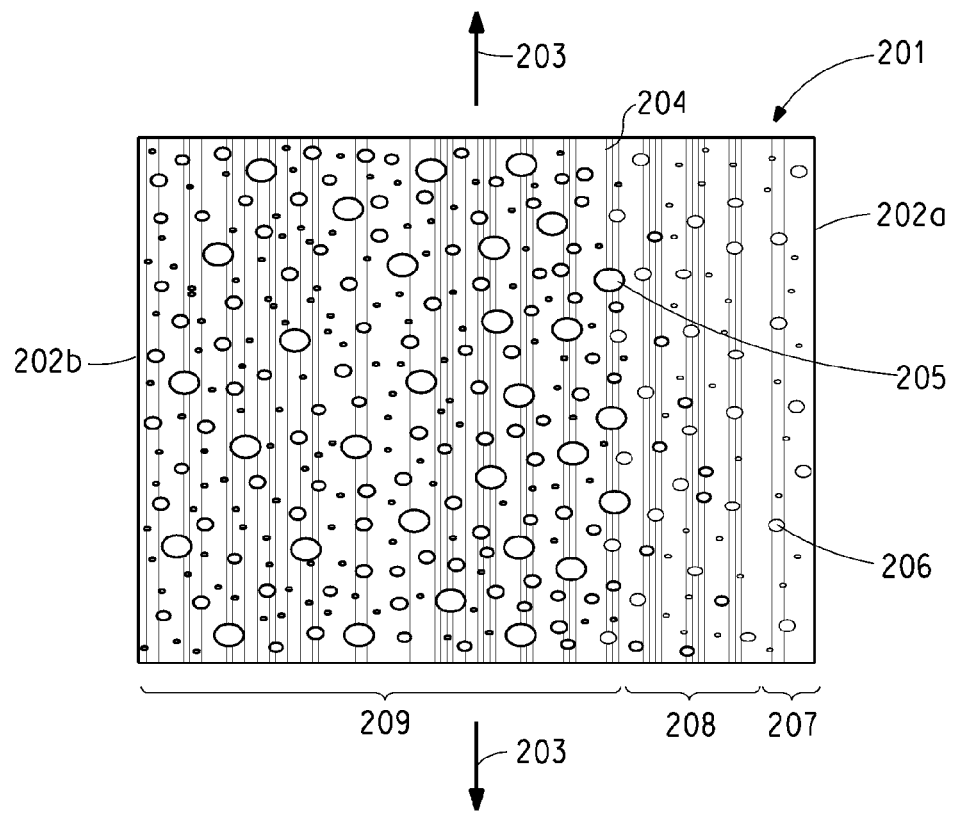
FIG. 2 shows an embodiment of the asymmetric film of the invention.

FIG. 2 shows an embodiment of the film, 201. The film, 201, has two parallel surfaces 202a and 202b, and a longitudinal direction of indefinite length indicated by the arrows, 203. Between the surfaces lies an interior comprising an uncured thermoset resin matrix, 204, within which are distributed a population of large particles, 205, and a population of small particles, 206. The region, 207, is a resin-rich region, having a homogeneous composition that is proximate to surface 202a. The region 208 is a transition region in which there is a gradient in particles concentration. Region 209 represents a filler-rich region of homogeneous composition that covers most of the thickness of the film, and is proximate to surface 202b. In other embodiments, the particles 205 and 206 may be of the same size, or their relative size reversed in relation to the filler-rich and resin rich regions.

The unitary structure of the asymmetric film, however, may serve as a distinct layer in a multi-layer structure comprising other elements. Such other elements can include a removable cover layer. In one embodiment, the asymmetric film is disposed onto a release film such as Mylar® PET (DuPont-Teijin Films, Wilmington, Del.). In a further embodiment a polyethylene release cover is laminated to the second surface of the film while a PET film is laminated to the first surface of the film. In practice, the polyethylene film is removed prior to deposition of the build-up layer on the core and PET is removed after the deposition. That embodiment has high utility in the preparation of multilayer chip carriers.

One process for forming multilayer chip carriers using this embodiment of the asymmetric film is shown schematically in FIG. 3. Referring to FIG. 3, following the process, supra, a polymeric film substrate, 5, is coated with the uncured dielectric build-up film, 1, with the first surface, 1a, of the uncured asymmetric film in contact with the polymeric film. 1b is the second surface of the film.

4 is a circuitized (that is, the copper is in the form of a plurality of discrete conductive pathways, 3) structure consisting of a core, 2, typically a cured, laminated structure with woven fiberglass with FR-4 or FR-5 type epoxy or bismaleimide-triazine resin.

The remainder of the description will be directed to a single layer of the thermoset resin coated polymeric film being laminated to the upward face of the circuitized core. However, as is made clear in FIG. 3, the identical steps may be performed upon the bottom face of the circuitized core either simultaneously or not.

In Step A: the uncured dielectric build-up film 1 is laminated to the circuitized core structure 4 using a platen press or preferably a vacuum laminator such as those available from Meiki Co. Ltd, Japan, and others. Using vacuum lamination, lamination temperature is in the range of 70 to 140° C., and lamination pressure is in the range of 0.1 to 1.5 MPa, preferably under reduced air pressure of 30 mbar or less. The polymeric film backing 5 is then removed from the thus laminated structure, forming structure 6. Some adjustment in lamination conditions may be required for resins having certain cure rheologies. In Step B the cure of the dielectric build-up film 1 is then completed in an oven, a press, or other heating device. Curing is typically effected in 1-2 hrs at 180° C. depending upon the specific resin characteristics. In Step C, elements such as vias, 7, through-holes, 8, and semi-through holes (not shown) are created by mechanical drilling, laser drilling, or other means, resulting in structure 9. In Step D, a so called "chemical desmear" procedure may be conducted to clear the holes and vias of debris and imperfections from the drilling process. Suitable swelling and desmear chemicals are "Securiganth P" or "MV "solution system" available from Atotech GmbH and practiced according to their recommended procedures. In Step E, electroless copper 10 is then deposited onto the exposed surfaces of structure 9. Suitable electroless copper chemical deposition methods are "Neoganth" and "Printoganth" systems available from Atotech GmbH, or "E-Prep" and "Electroless Copper 2000" available from Rockwood Electronic Materials, and practiced according to their recommended procedures. Typical electroless copper plating depth is of the order of 1 μm. In Step F, a photoresist 12 is applied to the structure 11 over the electroless copper layer 10. A suitable dry film resist is Riston® Photopolymer film available from the DuPont Company. The photoresist is then imagewise exposed to a photomask pattern, typically using laser radiation; and developed using well known photolithographic techniques. Suitable equipment is available from Tamarack Scientific Co. A photo resist with the desired circuit pattern is thereby formed, 12. In Step G, an additional amount of copper 14 is then deposited electrolytically onto the exposed electroless copper surface. Suitable electrolytic copper deposition chemistry and equipment are available from Technic Inc. Typical total copper thickness thus deposited is of the order of 15 to 36 µm. In Step H, the developed photoresist 12 is then removed and the structure subject to differential copper etching to remove the electroless copper layer under the photoresist, thus leaving a new layer of conductive pathways. 15. Suitable copper etching solutions are available from Atotech GmbH.

Additional layer(s) of circuits may be added over this structure by repeat the process described.

In another embodiment, the asymmetric film is applied to the surface of an electrically conductive metal foil to prepare a resin-coated foil. In one embodiment, the foil is a copper foil. The structure so formed has high utility in the preparation of multilayer chip carriers. One process for forming multilayer chip carriers using this embodiment of the asymmetric film is shown schematically in FIG. 4. Referring to FIG. 4, following the process, infra, a resin-coated foil, 25, is prepared by adheringly contacting a metallic, preferably copper foil, 25, with the first surface, 21*a*, of the uncured asymmetric film, 21. 21*b* is the second surface of the film. In one embodiment, the metallic backing is an electro-deposited copper foil. Preferably, the rough surface of the electro-deposited copper foil is used facing surface 21*a* to improve adhesive strength.

24 is a circuitized (that is, the copper is in the form of a plurality of discreet conductive pathways 23) structure comprising a core 22, typically a cured, laminated structure with woven fiberglass with FR-4 or FR-5 type epoxy or bismaleimide-triazine resin.

The remainder of the description will be directed to a single layer of the resin coated foil being laminated to the upward face of the circuitized core. However, as can be seen in FIG. 4, the identical steps may be performed upon the bottom face of the circuitized core either simultaneously or not.

In Step J, the resin coated foil 25, is then laminated to the circuitized core structure 24 using a platen press, a vacuum laminator, or a roll laminator and the like, forming the structure 27. Lamination temperatures are typically 70 to 140° C. depending on the specific resin formulation employed. In one embodiment, a vacuum laminator is used. In Step K, the cure of the dielectric film 21 is then completed in an oven, a press, or other heating device. Curing is typically effected in 1-2 hrs at 180° C. depending upon the specific resin characteristics. In Step L, so called "through holes" 28, are drilled in the structure 27 to connect the different layers of conductive pathways. Suitable drilling means include mechanical and laser drilling. Vias and other holes that do not connect throughout the thickness of the structure are optionally drilled depending on the circuit design. 29 is the resulting structure. In Step M, a so called "chemical desmear" procedure may be conducted to clear the holes and vias of debris and imperfections from the drilling process. Suitable swelling and desmear chemicals are "Securiganth P" or "MV "solution system" available from Atotech GmbH and practiced according to their recommended procedures. In Step N, a photoresist 30 is applied to the structure 29. A suitable dry film resist is Riston® Photopolymer film available from the DuPont Company. In Steps O, P: electroless copper is then deposited onto the exposed surfaces of hole 28, followed by electrolytic copper plating to build conductive pathways 32 for the holes. Both metallization processes were described earlier. In Step Q, the used photoresist 30 is then removed, resulting in structure 33. In Step R, a second photoresist film is then applied over the structure 33. The photoresist is then imagewise exposed to a photomask pattern, and developed using well known photo lithographic techniques. Suitable equipment is available from Tamarack Scientific Co. A photo resist with the desired circuit pattern 34 is thereby formed. The photoresist 34 protects the plated hole 32 created earlier. The resulting patterned multi-layer structure is designated 35. In Step S, the structure 35 is then subject to copper etching to remove the exposed copper regions. Suitable copper etching solutions are available from Atotech GmbH, thereby transforming 35 into 37. In Step T, the photoresist is then removed, leaving a new layer of conductive pathways 36. The final multi-layer chip carrier, 39, is thus formed Additional layer(s) of circuits may be added over structure 39 by repeating the process described.

The illustration described is not meant to be limiting. There are numerous different possible circuit designs as is well known in the art.

The present invention further provides a multi-layer chip carrier comprising a dielectric substrate having a surface, a first electrically conductive layer adheringly deployed upon at least a portion of the surface of the dielectric substrate, and an asymmetric film having a first film surface and a second film surface separated by an interior, the film comprising a cured thermoset resin with one or more fillers dispersed therewithin, the one or more fillers having a total concentration of 15% to 75% by weight based on the total combined weight of the cured thermoset composition wherein the interior the concentration of the one or more fillers exhibits a continuous gradient; each the one or more fillers having an average particle size in the range of 0.01 to 5 µm; the second surface being in conforming contact with the first electrically conductive layer, and the second surface being in adhering contact with a second electrically conductive layer disposed thereon.

In one embodiment of the multi-layer chip carrier, the asymmetric film further comprises a resin-rich region proximate to the first film surface.

In a further embodiment of the multi-layer chip carrier, the asymmetric film further comprises a filler-rich region proximate to the second film surface.

In a further embodiment of the multi-layer chip carrier, the asymmetric film further comprises a resin-rich region proximate to the first surface, a filler-rich region proximate to the second surface, wherein the transition region between the resin-rich and filler-rich regions wherein the concentration of the one or more fillers exhibits a continuous gradient.

In the multi-layer chip carrier, the asymmetric film comprises a cured thermoset resin. Suitable thermoset resins include those that, in the uncured or partially cured state, either with or without solvents, have solution viscosities of 10-3 to 10 Pa-s. Preferred are resins that have cure initiation temperatures of >50° C., more preferably >90° C. Preferred are resins suitable for electronic applications, having Tg ≧140° C. (cured state), moisture uptake of 5 weight % or less, preferred 2% or less (cured state) according to Japanese Industrial Standard JIS C6481, with dielectric constant less than 5 (at 1 GHz). Preferred are thermosets that do not generate volatile reaction products. Suitable resins include but are not limited to: epoxies, cyanate esters, bismaleimide-triazine, addition polyimides, unsaturated polyesters, butadiene, copolymers of mono-vinyl aromatic hydrocarbon with conjugated dienes, and combinations such as epoxy/cyanate ester, bismaleimide-triazine/epoxy.

Suitable multifunctional epoxies include but are not limited to phenol novolac epoxy, cresol-novolac epoxy, tetraglycidyl ether of diaminodiphenylmethane, triglycidyl tris(hydroxyphenyl) methane, trisphenol epoxy resin, triglycidyl ether of p-aminophenol, naphthalene epoxy resin, the epoxy derivative of triazine, the epoxy derivative of biphenol. Suitable epoxy compositions may further comprise a liquid or low melting point epoxy resin including but not limited to glycidyl ethers of bisphenol A, bisphenol F, and bisphenol S, and reactive diluents such as aliphatic epoxies."

Suitable curing agents include but are not limited to amines, amides, polyamides, polyamine adducts, acid anhydrides, organic acids, phenols and phenolic resins. Phenolic curing agents are particularly preferred for their moderating effects on viscosity of the composition and moderating effect on water uptake. Thermoset resins may also be homo-polymerized with suitable catalysts such as imidazoles, tertiary amines, dicyandiamide. Suitable phenol curing agents include bisphenol A, xylok type phenol resin, dicyclopentadiene type of phenol, terpene modified phenol resin and polyvinylphenol etc, or a combination of two or more of the above compounds.

The thermoset resin may further comprise a toughening agent such as carboxyl terminated butadiene, phenoxy, polyvinyl acetal, polyamide, polyamidimde, and polybutadiene.

Suitable fillers have an average particle size determined by light scattering of 0.01 to 5 µm. Suitable fillers include but are not limited to silica, alumina, talc, boron nitride, titanium dioxide, strontium titanate, calcium titanate, zirconia, mullite, cordierite; clays such as mica, bentone, and smectic clays; barium sulfate, barium titanate, and barium zirconate. Preferred are silica and alumina.

In one embodiment of the asymmetric film, a first filler characterized by an average particle size of 0.01 to 0.05 µm is combined with a second filler characterized by an average particle size of 0.1-5 µm. In another embodiment, some of the filler particles are surface treated in order to improve dispersion in the epoxy matrix.

The filler particles in the asymmetric film of the multi-layer chip carrier perform two quite different functions. On the one hand, the fillers in the filler-rich region provide reinforcement to the epoxy resin to reduce the coefficient of thermal expansion, minimizing the chance of delamination from the underlying first layer of the chip carrier. On the other hand, fillers proximate to, or at, the surface of the resin-rich region provide a desirable roughening effect during surface etching in preparation for applying a new metallic conductive layer.

In one embodiment, a single filler population is present, as indicated by a single characteristic size distribution curve. In another embodiment a dual filler population is present as indicated by a bimodal characteristic size distribution curve. In the case of a bimodal distribution, characterized by a smaller-size population and a larger-size population, the smaller-size population has an average particle size in the range of 0.01 to 0.05 µm, and the larger size population has a particle size in the range of 0.5 to 5 µm.

In one embodiment, the resin-rich region contains a plurality of finer filler particles than does the filler-rich region. In a further embodiment, the resin-rich region represents 25% or less of the thickness of the asymmetric film.

In one embodiment of the multi-layer printed circuit board, the asymmetric film comprises a resin-rich region of uniform composition. In a further embodiment, the resin-rich region comprises less than 5 weight-% of a filler. In an alternative embodiment, the resin-rich region comprises more than 5 weight-% of a filler but less than 40 weight-%.

In one embodiment of the multi-layer chip carrier the asymmetric film comprises a filler-rich region of uniform composition. In a further embodiment of the multi-layer chip carrier the filler-rich region comprises more than 40 weight-% but less than 80 weight-% of a filler.

In another embodiment of the multi-layer chip carrier the asymmetric film comprises a resin-rich region of uniform composition proximate to the first film surface, the resin-rich region having a filler concentration of 0 to 40 wt-%; a filler-rich region of uniform composition proximate to the second film surface, the filler-rich region having a filler concentration of 40 to 80 wt-%; and a gradient region characterized by a continuous gradient in filler concentration disposed between the resin-rich region and the filler-rich region.

In another embodiment of the multi-layer chip carrier the asymmetric film consists essentially of a resin-rich region of uniform composition proximate to the first film surface and a gradient region proximate to the resin-rich region on one side and the second film surface on the other. In this embodiment of the multi-layer chip carrier, there is no filler-rich region of uniform composition.

In another embodiment of the multi-layer chip carrier the asymmetric film consists essentially of a filler-rich region of uniform composition proximate to the second film surface and a gradient region proximate to the filler-rich region on one side and the first film surface on the other. In this embodiment of the multi-layer chip carrier, there is no resin-rich region of uniform composition.

In another embodiment of the multi-layer chip carrier the asymmetric film consists essentially of a gradient region proximate to both the surfaces. In this embodiment of the multi-layer chip carrier, there is no region of uniform composition proximate to either the surface.

Figure 3A:
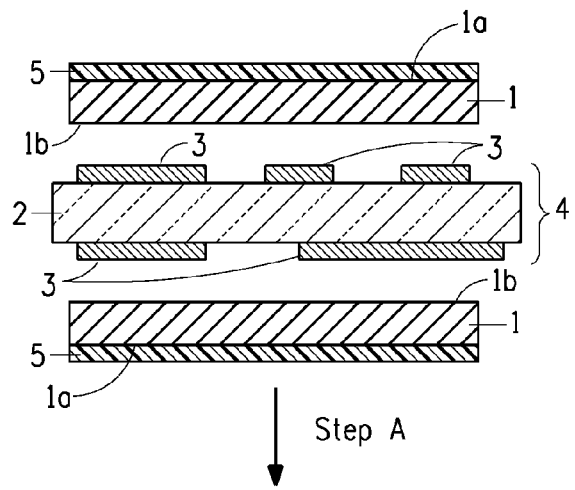
FIG. 3 shows in schematic form a process for preparing a multi-layer chip carrier starting with an asymmetric film according to an embodiment of the invention on a polymeric film backsheet.
Figure 3B:
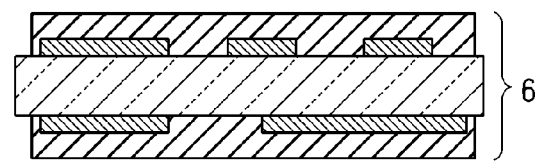
Figure 3C:
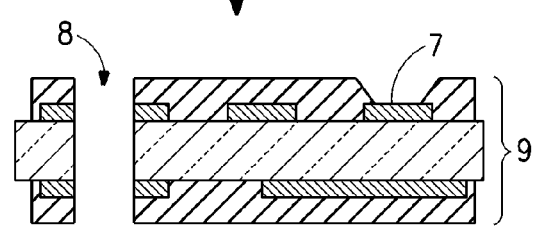
Figure 3D:
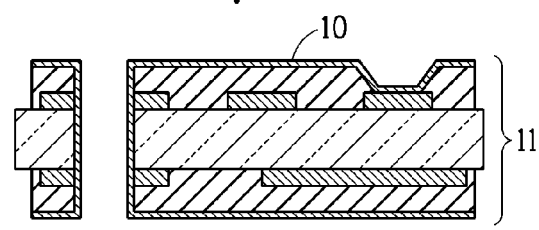
Figure 3E:
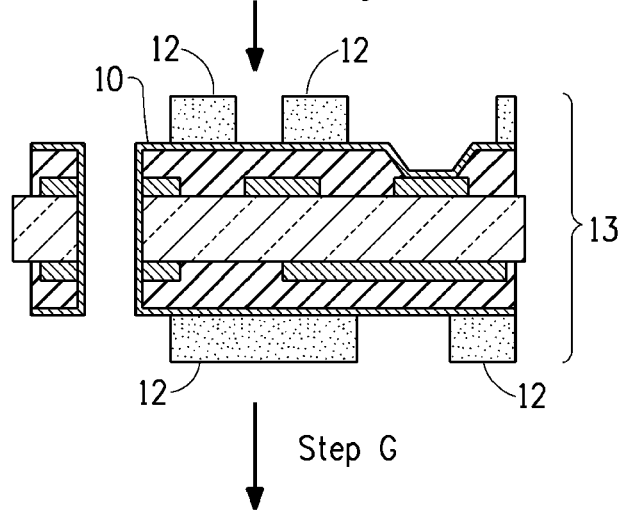
Figure 3F:
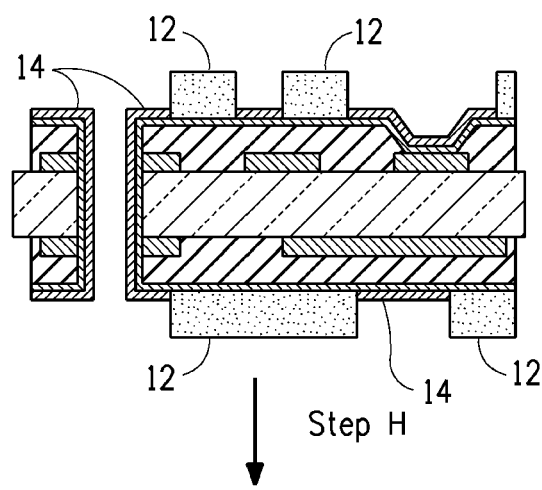
Figure 3G:
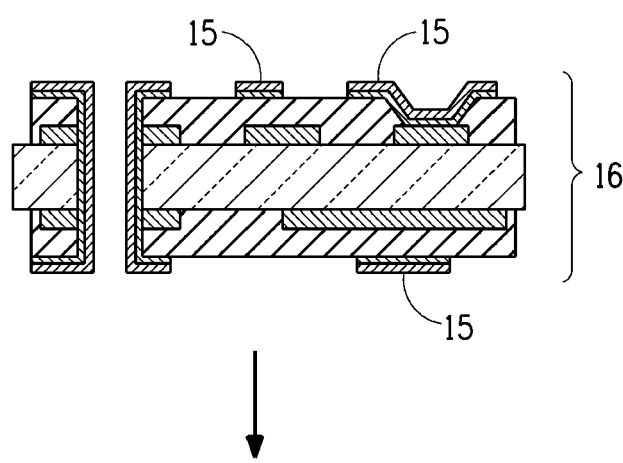
Figure 4A:
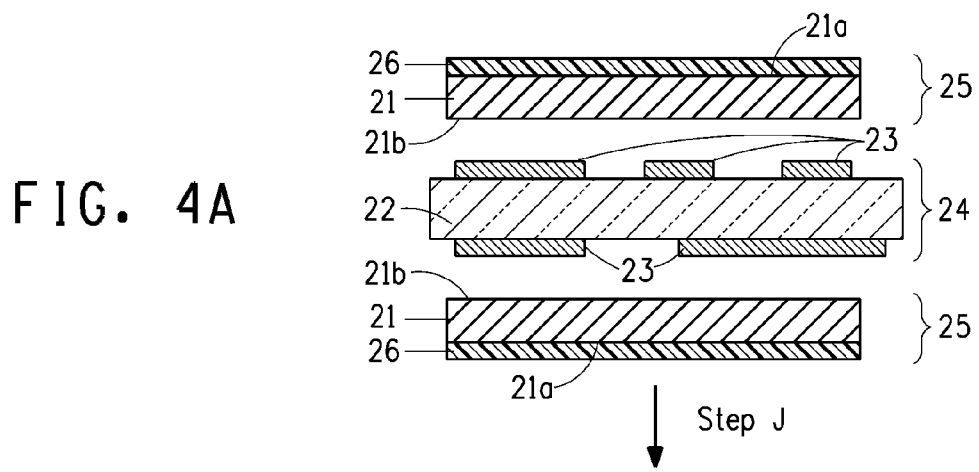
FIG. 4 shows in schematic form a process for preparing a multi-layer chip carrier starting with a resin-coated foil.
Figure 4B:
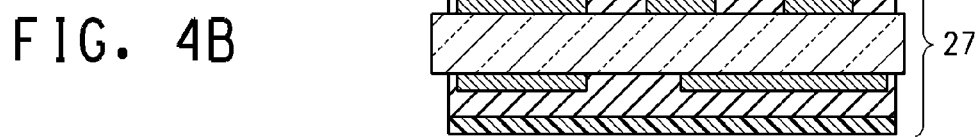
Figure 4C:
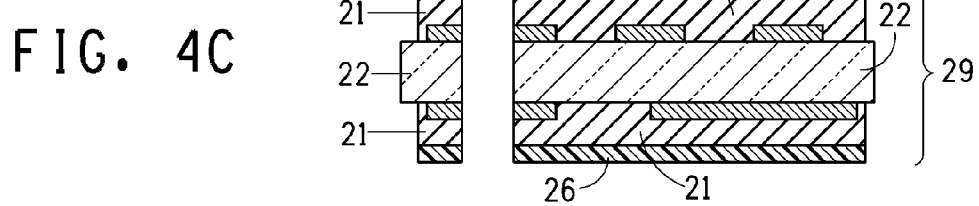
Figure 4D:
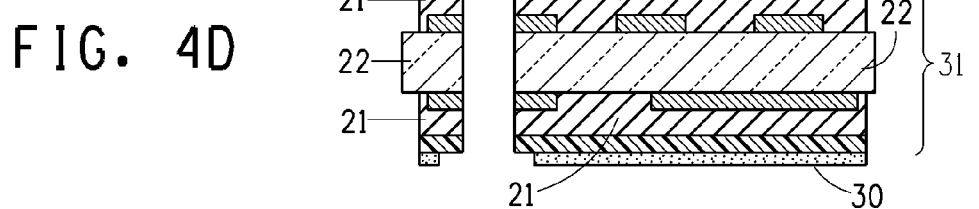
Figure 4E:
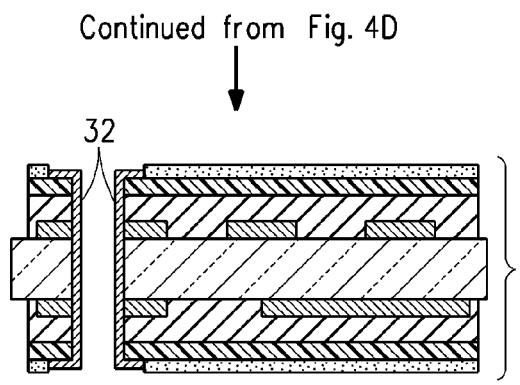
Figure 4F:
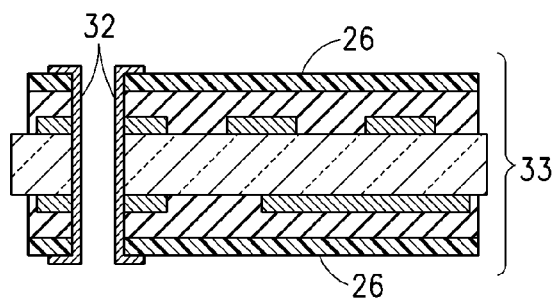
Figure 4G:
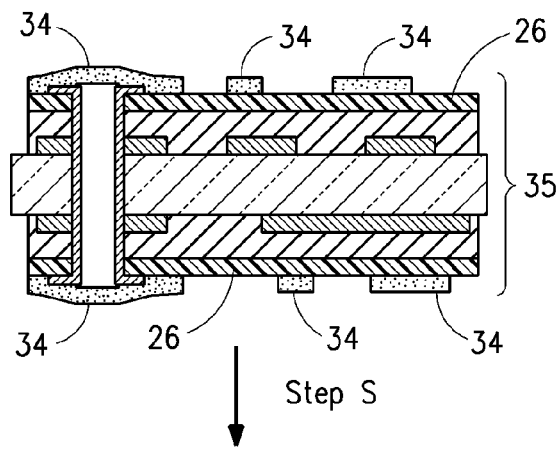

One embodiment of the multilayer chip carrier is shown schematically in FIG. 3G after Step H, described supra.

The present invention further provides a process comprising: forming a first liquid mixture comprising an uncured thermoset composition and a first inorganic filler dispersed therewithin, the concentration of the filler being in the range of 0 to 40% by weight with respect to the total combined weight of said first thermoset composition excluding solvents and volatiles, the filler having an average particle size in the range of 0.01 to 5 µm; forming a second liquid mixture comprising the uncured thermoset composition and a second inorganic filler dispersed therewithin, the concentration of the filler being in the range of 16 to 80% by weight with respect to the total combined weight of said second cured thermoset composition excluding solvents and volatiles, the filler having an average particle size in the range of 0.01 to 5 µm; forming a first coating from the first liquid mixture, and a second coating from the second liquid mixture; wherein each of the first and second liquid mixtures has a viscosity in the range of $10^{-3}$ Pa-s to 10 Pa-s at the temperature at which the respective coating is formed; contacting the first coating with the second coating, thereby forming a combined coating, wherein at the first point of contact, the viscosity of at least one coating is in the range of $10^{-3}$ to 10 Pa-s, and wherein that the viscosities of both coatings are not simultaneously in the range of $10^{-3}$ to 0.4 Pa-s. Preferred is for the coating with lower filler content to have a viscosity greater than 0.6 Pa-s while the coating with the higher filler content to have a viscosity in the range of 0.2 to 4 Pa-s In the processes disclosed herein, the thermoset resin itself may be a liquid at room temperature, in which case a solvent is not required. When the thermoset resin is a solid at room temperature, then the process further comprises one or more solvents in which the thermoset is soluble.

Suitable solvents include but are not limited to ketones, ether acetates, hydrocarbons, and mixtures. Suitable ketones include but are not limited to acetone, methyl ethyl ketone, cyclohexanone, cyclopentanone, and methyl isobutyl ketone. Suitable ether acetates include but are not limited to diethylene glycol monoethyl ether acetate, and propylene glycol monomethyl ether acetate. Suitable hydrocarbons include but are not limited to toluene and xylene. Polar solvents can also be employed including but not limited to N-methyl-2-pyrrolidone, N,N-dimethylacetamide, N,N-dimethylformamide. Mixtures of solvents may also be employed. Water-dispersible epoxies may also be used.

When a solvent is present, the process further comprises extraction of the solvent to form a film.

The first and second inorganic fillers can be the same or different. In one embodiment of the process, the first and second fillers are the same. A filler suitable for the process has an average particle size in the range of 0.01 to 5 µm.

In one embodiment the first and second fillers are different. In one embodiment, the first filler is a silica having an average particle size of 0.01 to 0.05 µm and the second filler is a silica having an average particle size in the range of 0.5 to 5 µm. In another embodiment one of the fillers is surface treated with agents such as, for example, epoxy functionalized silanes, amine functionalized silanes.

Further according to the process, the first and second liquid mixtures are formed as coatings that are in contact with one another to form, after drying, the single layer asymmetric film. In one embodiment the first liquid mixture is formed into a first coating that is applied to a substrate having a release surface so that the substrate can be peeled off the resulting film at a later time in the process of preparing a multi-layer chip carrier. One such process is illustrated in FIG. 3.

In another embodiment, the first solution is formed into a first coating that is applied to a conductive metal foil for subsequent use in the preparation of multi-layer chip carriers. One such process is illustrated in FIG. 4.

In one embodiment of the process, designated the "two step process," the first coating is subject to solvent extraction before contact with the second coating. In one embodiment solvent extraction is effected by heating, reducing the solvent content to less than 15% by weight of the total composition, preferably less than 5%. (Some residual solvent serves to plasticize an otherwise potentially brittle film.) However, the heating cannot be sufficient to advance the curing to the gel point. In general, the film should be heated to less than the boiling point of the lowest boiling solvent to avoid creating blisters, or to the cure initiation temperature of the formulation to avoid curing the resin substantially. Effectiveness of solvent removal in an oven depends on temperature, residence time, and the drying gas flow speed. 1-3 min. residence time at 110° C. has been found to be effective.

Other suitable solvent extraction methods include vacuum, microwave, and liquid extraction. The dried coating remains in the form of a shape-retaining film. In a further step in this embodiment of the process, the shape retaining film is coated by the second liquid mixture, wherein the second solution has a viscosity of <2 Pa-s, preferably <0.1 Pa-s. A viscosity greater than 2 Pa-s will create a two layer film structure, not the asymmetric film.

In another embodiment of the process, which shall be designated "the one step process," the first solution and the second solution have viscosities in the range of $10^{-3}$ to 10 Pa-s at the temperature at which the respective coating is formed with the proviso that the viscosities of both coatings are not simultaneously in the range of $10^{-3}$ to 0.4 Pa-s. Preferred is for the coating with lower filler content to have a viscosity greater than 0.6 Pa-s while the coating with the higher filler content to have a viscosity in the range of 0.2 to 4 Pa-s. In this embodiment, the first solution is fed through a first die on to a substrate to form a first coating and the second solution is fed through a second die atop the first coating prior to extraction of the solvent from the first coating. In practical terms, in order to bring the second die as close as possible to the first die, the first die and the second die may be incorporated into a single die block as a dual slot die with independent feeds.

An embodiment of the one-step process is shown schematically in FIG. 5.

The processes disclosed herein are affected by the degree of mixing between the first coating and the second coating. An insufficient degree of mixing, such as occurs when both the coatings upon mutual contact exhibit viscosity above about 10 Pa-s, results in a bi-layer film structure having a distinct interface between the layers. An excessive degree of mixing results in a single layer homogeneous or symmetric film. Thus to achieve the benefits of the present invention, it is desirable to control the degree of mixing to an intermediate stage.

In the processes disclosed herein, three "forces" have been found to influence the degree of mixing: dissolution and diffusion, inertia, and gravity. In the two-step process, described supra, the liquid in [to account for systems w/o solvents] the second solution causes the uncured thermoset in the extracted first coating to redissolve and mixing between the first and second coating occurs, eliminating the interface between the two layers. At the same time, gravity and diffusion cause the vertical migration of the filler particles in the second coating toward the first coating.

In the one step process, described supra, the first and second liquids being miscible, the solutions rapidly undergo mixing while the forces of inertia and gravity again cause migration of the fillers. The higher the inertial rate of injection of the second liquid mixture into the first liquid mixture, and the lower the viscosities of the solutions, the greater the degree of inertial mixing.

In both the one-step and two-step processes, the viscosities determine the rate of mixing of both polymer and filler. In reference to the one-step process, depending upon the thickness of the layers, the film can have one of three general morphological forms. In FIG. 2, the resin-rich region, 207, is less than about $\frac{1}{10}$ in extent compared to the filler-rich region, 209. The transition region, 208, is much closer to surface 202a than it is to surface 202b. The embodiment represented by FIG. 2 can be prepared by targeting the thickness of the first coating to be about $\frac{1}{7}^{th}$ the target thickness of the second coating. In other embodiments, the coatings are of approximately equal thickness when deposited, resulting in a transition zone located closer to the midway point between the first and second surfaces. In still another embodiment, the second coating can be thinner than the first coating, resulting in a transition zone closer to the second surface, and a less extensive filler-rich region than resin-rich region. Similar variations in morphology can be obtained by maintaining equal coating thickness but changing the relative viscosities of the solutions within the ranges designated supra. Of course coating thickness and relative viscosity can both be varied.

Further provided in the present invention is a process comprising: conformably laminating an uncured formable asymmetric thermoset film to a circuitized dielectric core to form a laminated circuitized dielectric core comprising an uncured laminated asymmetric thermoset film, the asymmetric thermoset film having a first film surface and a second film surface, the surfaces being parallel to one another and separated by an interior, the film comprising an uncured thermoset resin with one or more fillers dispersed therewithin, the one or more fillers having a total concentration of 15% to 75% by weight with respect to the weight of the uncured thermoset resin, wherein the interior the concentration of the one or more fillers exhibits a continuous gradient; each the one or more fillers having an average particle size in the range of 0.01 to 5 micrometers (μm); the second surface being in conforming contact with the circuitized dielectric core layer, thermally curing the uncured laminated asymmetric thermoset film to form a cured laminated circuitized dielectric core;

introducing vias, through-holes, and semi-through holes in the laminated circuitized dielectric core;

roughening the exposed surfaces in the laminated circuitized dielectric core with chemical desmearing agents;

adheringly applying a metallic layer to the first surface of the asymmetric film;

covering at least a portion of the exposed metallic layer with a photoresist surface;

imagewise exposing the photoresist surface, and developing the photoresist to form a pattern upon the imagewise exposed photoresist coating;

increasing the thickness of the exposed metallic layer using means such as electrolytic deposition;

removing the residual photoresist surface;

etching the patterned surface to remove unwanted conductive material to produce a pattern of discrete conductive pathways thereupon;

In a further embodiment of the process an integrated circuit is electroconductively contacted to at least a portion of the discrete conductive pathways.

The asymmetric film is useful as a dielectric build-up layer between layers of a multi-layer chip carrier. In typical use, a chip carrier, comprising a dielectric substrate with discrete conductive pathways disposed thereon, is placed in contact with the second surface of the solvent-extracted uncured asymmetric film. Pressure and, usually, heat are applied to the asymmetric film, thereby causing the asymmetric film to conform to the conductive pathways and the dielectric substrate between the conductive pathways. The required combination of pressure, temperature, and time depends on the rheology of the formulation. It is found in the practice of the invention that the Meiki Vacuum Laminator, supra, requires about 120° C. for about 3 minutes to effect a satisfactory result. Typical way to know if thermal forming is acceptable is by curing and taking cross-sectional micrographs. In a typical use, the uncured asymmetric film will be disposed upon a removable substrate or backing surface, as shown in FIG. 3a. After being formed into the dielectric build-up layer, the substrate or backing sheet, typically PET, is then peeled off, FIG. 3b. Also after the formation of the asymmetric film into the dielectric interlayer, the resulting structure is heated to a rapid curing temperature, to cure the epoxy, thus resulting in a multilayer structure comprising a chip carrier and a cured asymmetric film formed thereto. The newly exposed second surface of the asymmetric film serves as the adhesive surface for a second layer of conductive pathways.

The second layer of conductive pathways is prepared by first etching the second surface of the asymmetric film to create a roughened surface. It is highly preferred that the roughened surface have pits and other features no larger than about 10%, preferably no larger than 5%, of the distance between conductive pathways. Surface etching or roughening can be accomplished by any method that provides the desired features, including mechanical, chemical, particle beam, or laser. A common method is a swell/etch procedure using chemicals available from Atotech GmbH. The etching chemical is an alkaline permanganate oxidizing agent.

In the asymmetric film it is desired that proximate to the first surface there be a region rich in a filler having a particle size in the range of 0.01 to 0.5 μm.

It has been found in the practice of the invention that if the cured epoxy resin undergoes etching, then the first coating may be of any thickness, and filler can be absent in the region proximate to the first surface. If the cured epoxy resin does not undergo etching and the weight percent of the filler is ≧5% in the first coating, the thickness of the first coating may be of any thickness. However, if the epoxy resin does not undergo etching and the weight percent filler present in the first coating is <5%, the first coating thickness is desirably 5 μm.

Once the first surface of the cured asymmetric film has been roughened, a metallic conductive layer is laminated thereupon as described supra. The thus laminated layer is then subject to transformation into a second layer of discrete conductive pathways using methods well-known in the art. One particularly useful and well-known method is by photolithographic methods, such as are described supra.

In the photolithographic, or microlithographic, preparation of chip carriers, a laminated structure such as that shown in FIG. 3, is coated with a photoresist, imagewise exposed to a circuit pattern, developed and etched to produce the desired pattern of discrete conductive pathways.

Both positive working photoresists and negative working photoresists are suitable for use in an immersion photolithography process of the invention. A positive working photoresist is defined as a resist where the exposure to light, leads to a change in the dissolution behavior of the polymer, such that after development, the exposed regions of the photoresist dissolve away into the developer. Negative working photoresists, have the opposite tone, and the exposed regions stay, while the unexposed regions will dissolve in the developer. The photoresist, when exposed to light, forms what is called a latent image. In a typical method, a chemically amplified, positive tone, resist, that contains a photoacid generator, or PAG, is employed. The photoresist layer comprising the latent image is then subject to a post exposure bake (PEB) step, whereby the photoacid generator produces photoacid, which then catalytically breaks down the backbone of the photoresist. After this PEB step, the photoresist coated conductive layer is then put into an aqueous base developer, such as a 0.26 Normal TMAH developer, whereby the exposed regions of the polymer film are developed away, and the patterned photoresist is observed. Following development of the photoresist pattern, an etching step is employed to remove the unwanted conductive material.

In a typical application, the surface of the conductive layer is coated with a dry photoresist by depositing a film, using known methods. Following coating, the thus coated surface is imagewise exposed. Exposure may be conducted with the coated surface immersed in a so-called immersion liquid, or just exposed to air.

Imagewise exposure is typically conducted by transmission of laser light through a photomask, typically comprising a chrome metal circuit patterned on glass by electron beam imaging, forming an image of the circuit pattern on the photoresist covered surface. Numerous materials for use as photoresists are well known in the art and are in widespread commercial use. All such materials are suitable for the practice of the present invention so long as they are functional at the exposure wavelength and are insoluble in any immersion fluid if one is used. Suitable photoresist compositions are described in *Introduction to Microlithography, Second Edition* by L. F. Thompson, C. G. Willson, and M. J. Bowden, American Chemical Society, Washington, D.C., 1994. The exposure radiation source is not critical.

The invention is further described in but not limited by the following specific embodiments.

EXAMPLES

Example 1

The viscosity of epoxy resin solutions was measured to illustrate the effect of solids content and solvent type on an epoxy formulation. The epoxy formulation consisted of: 62.5 weight % o-cresol novolac epoxy (Aldrich Chemical Product number 408042), 6.3 weight % bisphenol-A (Aldrich 133027, CAS 80-05-7), 25.0 weight percent phenol-dicyclopentadiene (Borden Chemical, Durite ESD-1819), 6.3 weight % phenoxy resin (Inchem corp PKHH). No catalyst was included. The viscosity was measured at room temperature with a Brookfield Engineering Laboratories, Inc Model LVDV-II-+Pro viscometer using a number 18 spindle.

Figure 6:
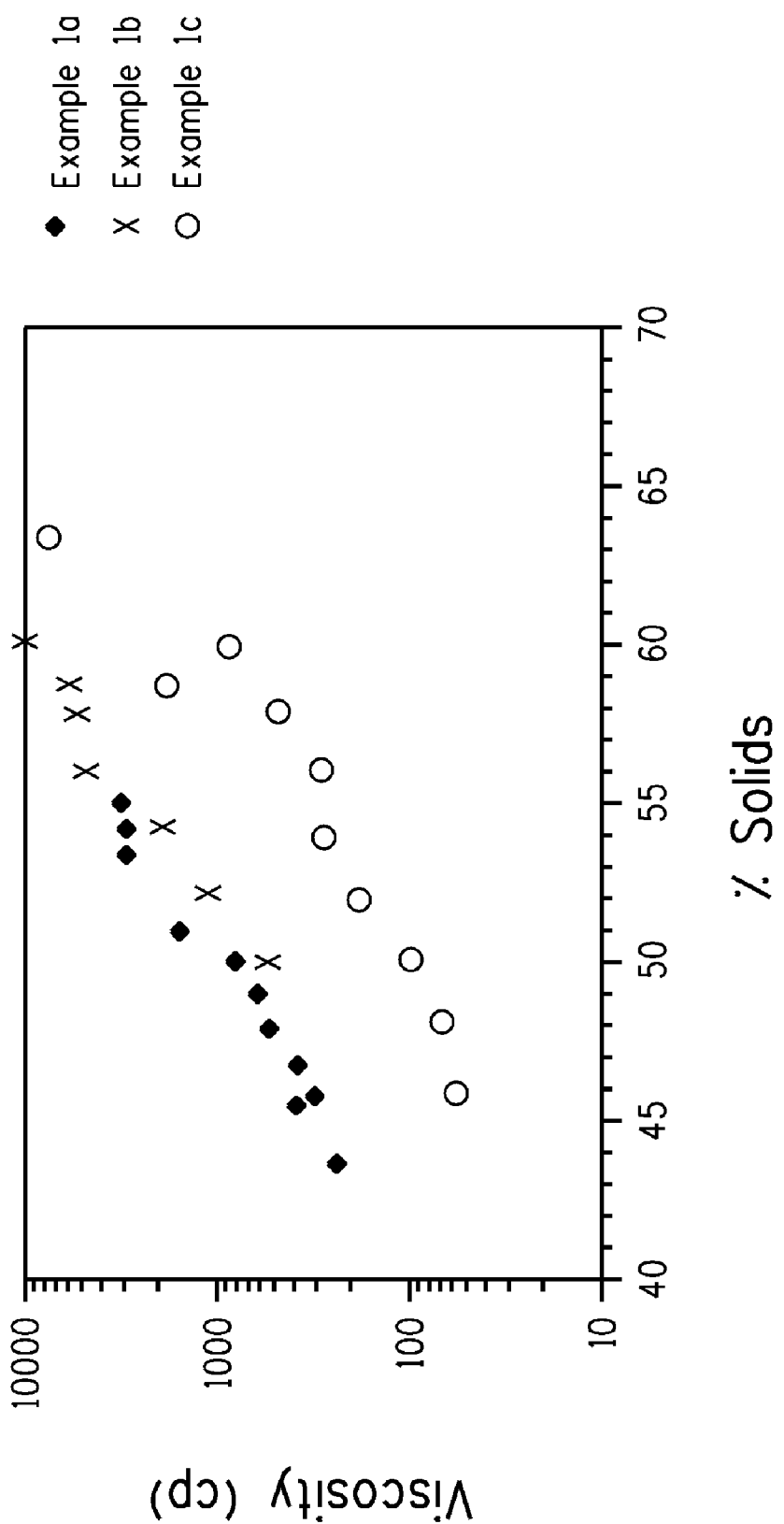
FIG. 6 shows graphically the effect of % solids of an epoxy solution on viscosity.

Three series of solutions varying in % solids were prepared, as shown in Table 1 and FIG. 6.

TABLE 1

| Example | Solvent | Filler |
|---|---|---|
| 1a | cyclohexanone | none |
| 1b | cyclohexanone/MEK | 10 phr* |
| 1c | cyclohexanone/MEK | none |

*10 parts silica to 100 parts resin.
The filler was a spherical sililca of 0.5 micrometer diameter.

Examples 2-28 and Comparative Example A

Except where otherwise stated, the epoxy resin composition employed in the following examples and comparative examples consisted essentially of an aromatic glycidyl ether epoxy with a high molecular weight fraction, as described supra, with an epoxy to hydroxyl ratio of 1.9, a toughener, phenolic curing agent and an imidazole catalyst. The resin composition was dissolved in a 50/50 mixture of cyclohexanone and 2-butanone.

Whenever filler was used, it was a spherical silica of average diameter 0.5 μm. Filler dispersion was accomplished by in line stator and rotor mixing for around 1 hour. No mixing was done when no filler was used.

Comparative Example A 24.5 weight percent of the uncured epoxy resin described supra was combined with 10.5 weight % silica in 65 weight percent of a 50/50 mixture of cyclohexanone and 2-butanone. The resulting first solution-dispersion was applied to a Mylar® PET film (Dupont Teijin Films, Wilmington, Del.) using a Dupont Color Versatility® metering rod-type coater. The film was dried in the coater at 45° C. for 30 minutes, then left under ambient conditions for 2 days. The thus dried film was then further dried at 110° C. for 30 minutes resulting in a film 5 μm thick. This film was designated layer 1.

Figure 7:
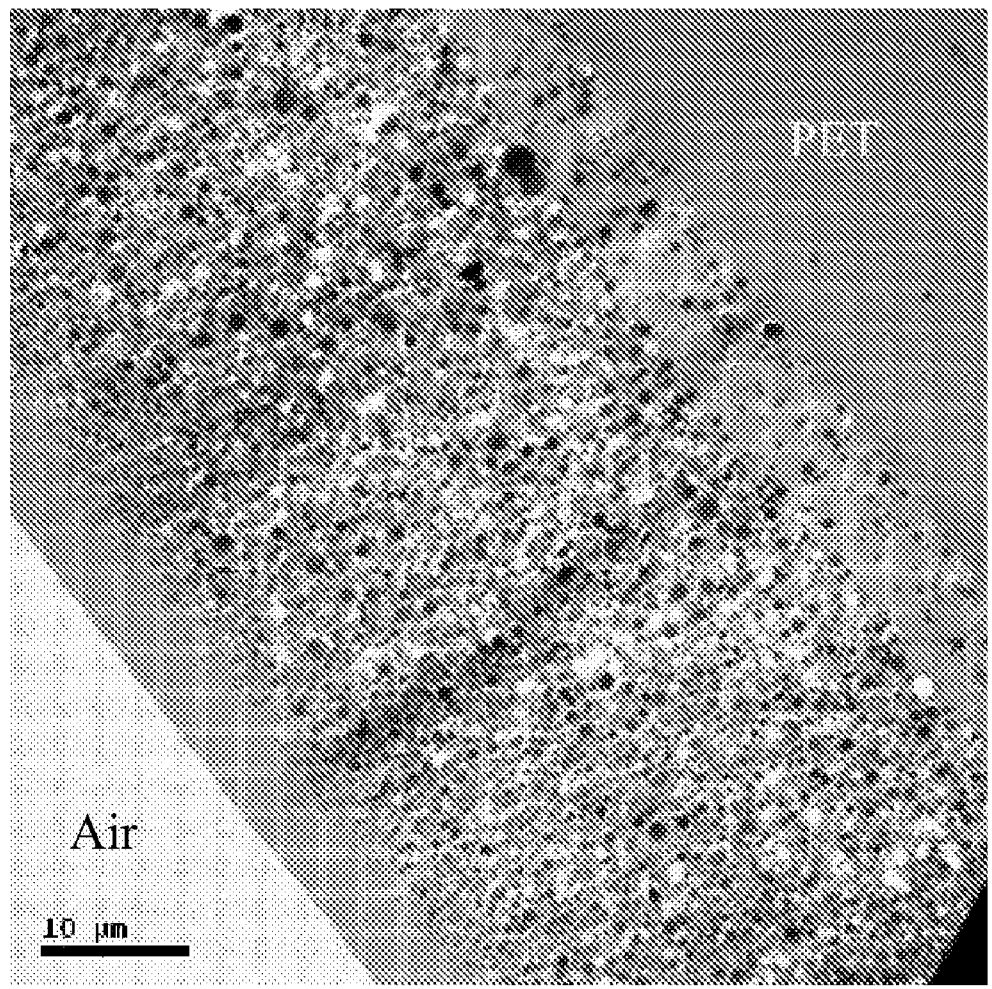
FIG. 7 shows the transmission electron micrograph (TEM) results of Comparative Example A.
Figure 8:
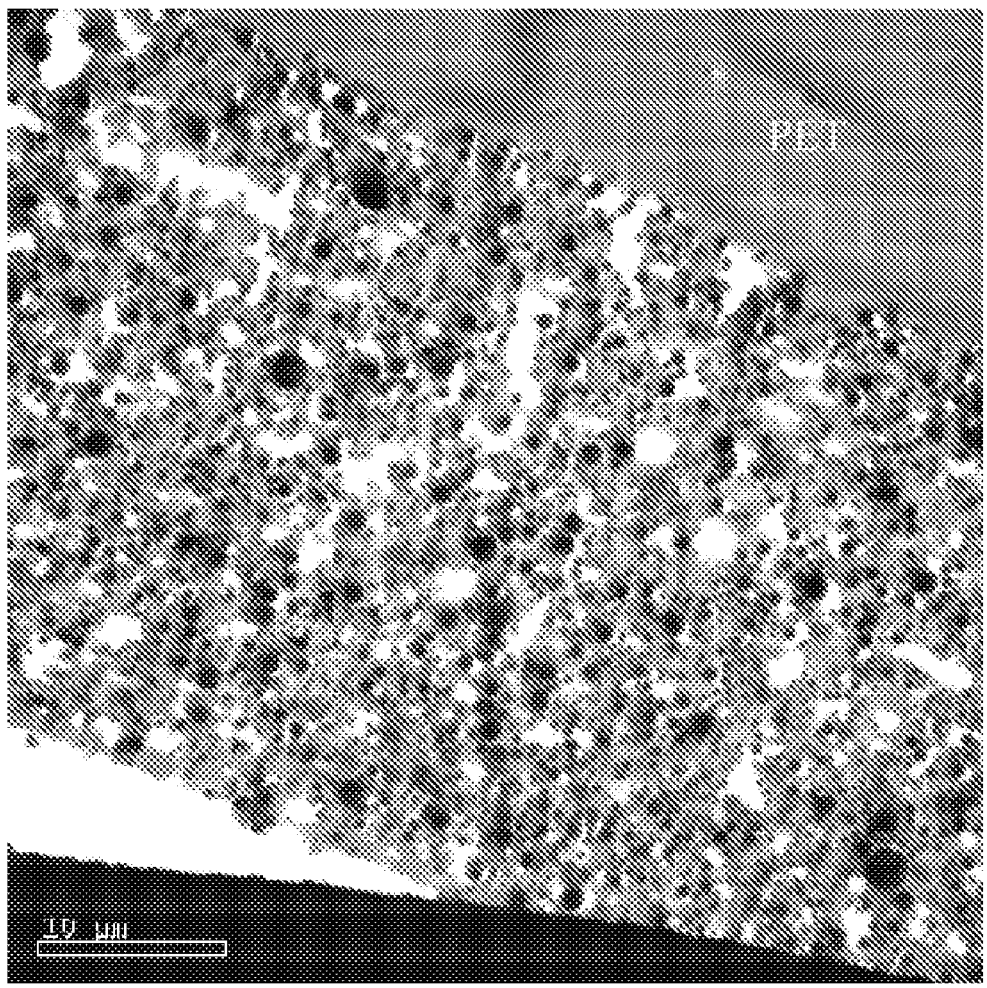
FIGS. 8-11 show transmission electron micrograph (TEM) results from Examples 10, 13, 17 and 18 respectively.
Figure 9:
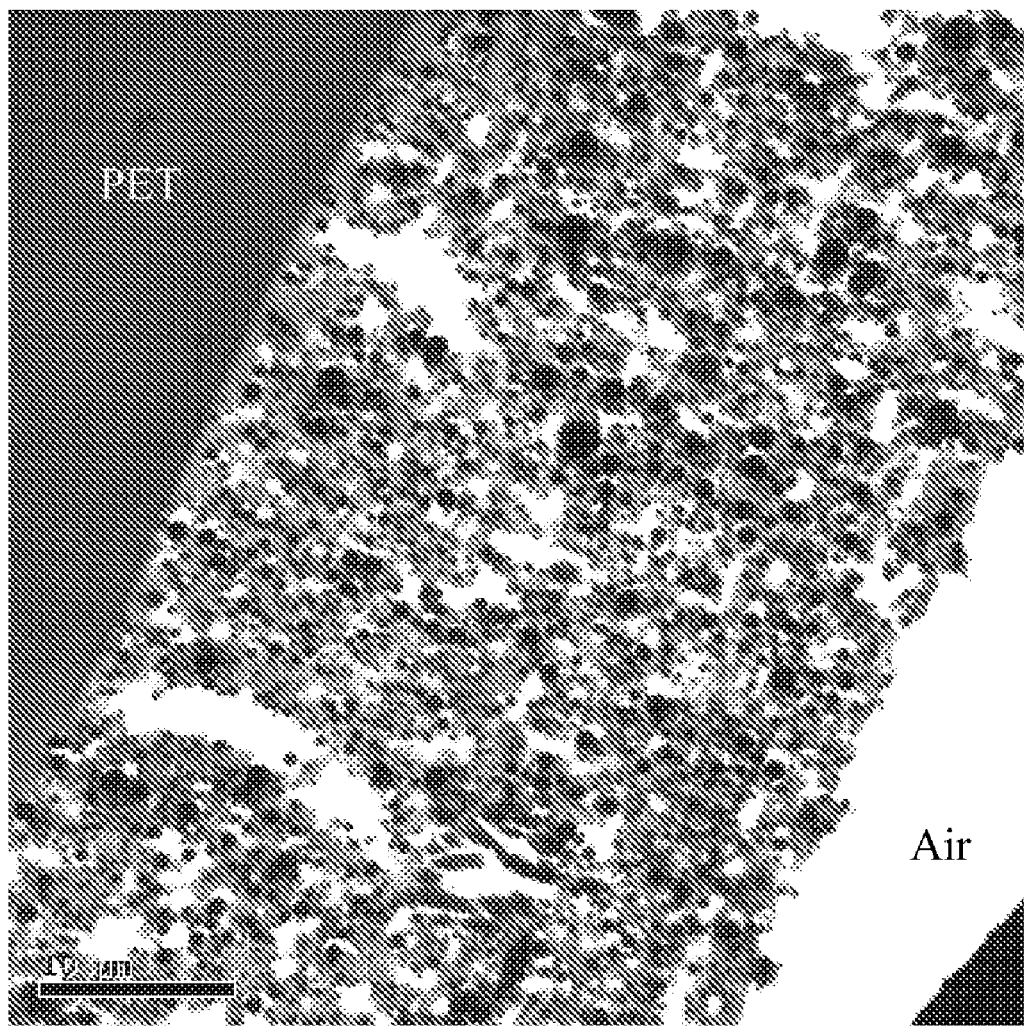
Figure 10:
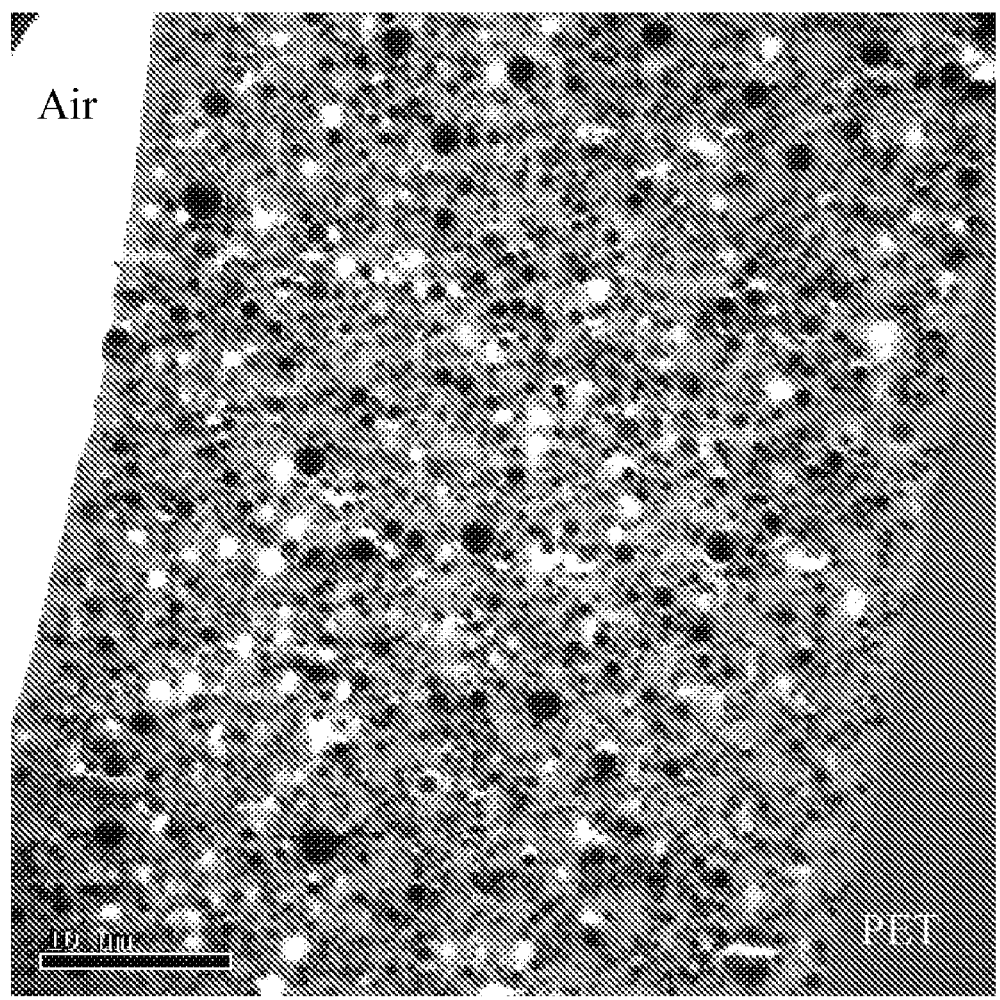
Figure 11:
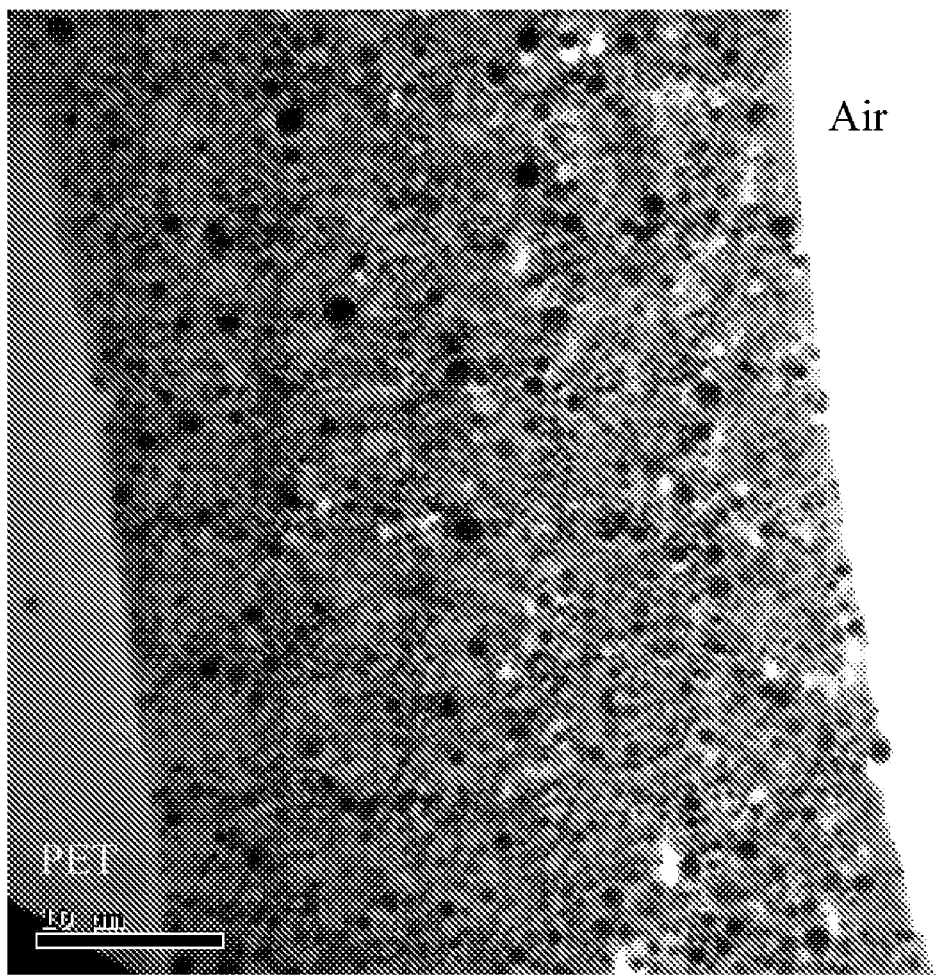

A second epoxy solution dispersion was prepared in a similar manner to that of the first, except with 18 weight percent of the uncured epoxy, 22 weight percent spherical silica, and 60 weight percent of the solvent. This second epoxy dispersion was coated over film layer 1 using a doctor blade such that the second layer thickness was approximately 35 microns after drying. The thus formed film was allowed to air dry for 15 minutes then dried in a vacuum oven at for 1 hour at 70° C. A TEM (transmission electron microscopy) photomicrograph of the cross section of the uncured film sample is shown as FIG. 7. Two distinct layers can be seen, with a clear interface between them.

Examples 2-28

In the following Examples, a dual-slot coating die having two independent feed streams was used to apply two coatings in rapid succession, one on top of the other, on a 38 μm-thick Mylar® PET substrate, with negligible solvent loss between application of the first coating and application of the second. The resin, solvent, and silica used were same as in Comparative example A. The specific compositions are shown in Table 2. The process employed is shown schematically in FIG. 5. The dual slot coating die, 501, had a first coating feed, 502, corresponding to "Feed A" in Table 2, characterized by a first die gap, 503, and a second coating feed, 504, corresponding to "Feed B" in Table 2, characterized by a second die gap, 505. The dual slot die, 501, was disposed to discharge the coatings onto a 38 micrometer thick Mylar® PET (DuPont Teijin Films, Wilmington, Del.) continuous film substrate, 506, moving vertically upward, 507. The exiting streams coalesced upon exiting the dies, as shown. As the Mylar® moved vertically upward, it entrained the coalesced streams so that the exposed surface of the stream, 508, from die opening 503 coated the Mylar® surface with the stream, 509, from die opening 505 disposed on the other side of the exiting stream. The distance from the die lips to the substrate surface was maintained at under 200 μm (0.008"), and was adjusted within that limit until the extruded film had a smooth visual appearance. The thus coated Mylar® substrate then advanced to a convection drying oven, not shown, where the solvent was extracted, leaving the shape-retaining, formable uncured asymmetric film of one embodiment. The oven was set at 93° C. at the entrance, increasing to 115° C. at the exit. The gradual disappearance of the interface between the two coatings, characteristic of the process of the present invention, is shown schematically as well.

The viscosities of the dispersions were measured at room temperature using a Brookfield Engineering Laboratories, Inc. Model DV-E viscometer using a number 31 spindle.

TABLE 2

| | Feed A | | | | Feed B | | | |
|---|---|---|---|---|---|---|---|---|
| | Viscosity, | Dispersion composition, weight % | | | Viscosity, | Dispersion composition, weight % | | |
| Example | cp | solvent | silica | resin | cp | solvent | silica | resin |
| 2 | 871 | 45 | 0 | 55 | <50 | 44.7 | 30.4 | 24.9 |
| 3 | | | | | | | | |
| 4 | | | | | | | | |
| 5 | | | | | | | | |

TABLE 2-continued

| | Feed A | | | | Feed B | | | |
| --- | --- | --- | --- | --- | --- | --- | --- | --- |
| | Viscosity, | Dispersion composition, weight % | | | Viscosity, | Dispersion composition, weight % | | |
| Example | cp | solvent | silica | resin | cp | solvent | silica | resin |
| 6 | 1370 | 41.2 | 0 | 58.8 | 136 | 34.2 | 36.2 | 29.6 |
| 7 | | | | | | | | |
| 8 | | | | | | | | |
| 9 | | | | | | | | |
| 10 | 939 | 45 | 0 | 55 | 274 | 31.5 | 37.7 | 30.8 |
| 11 | | | | | | | | |
| 12 | | | | | | | | |
| 13 | 939 | 45 | 0 | 55 | 1382 | 27.9 | 39.7 | 32.5 |
| 14 | | | | | | | | |
| 15 | | | | | | | | |
| 16 | 618 | 45 | 8.2 | 46.7 | 274 | 31.5 | 37.7 | 30.8 |
| 17 | | | | | | | | |
| 18 | | | | | | | | |
| 19 | 658 | 45 | 2.8 | 52.3 | 360 | 31.5 | 37.7 | 30.8 |
| 20 | | | | | | | | |
| 21 | | | | | | | | |
| 22 | 725 | 45 | 5.5 | 49.5 | 360 | 31.5 | 37.7 | 30.8 |
| 23 | | | | | | | | |
| 24 | | | | | | | | |
| 25 | 725 | 45 | 5.5 | 49.5 | 1368 | 28.2 | 39.5 | 32.3 |
| 26 | | | | | | | | |
| 27 | | | | | | | | |
| 28 | 870 | 42 | 14.5 | 43.5 | 430 | 31.5 | 37.7 | 30.8 |

When silica particles were included as indicated in Table 2, the dispersion was aggressively mixed using a high shear mixer for about an hour.

Coating conditions are shown in Table 3. Two process variables were adjusted to set thickness, the solution pump speed and the line speed. The nominal thickness of the coating from Feed B was determined as follows. An initial pump speed and line speed were set. Feed B only was fed to the die, therefore being coated directly onto the moving Mylar® substrate. The resultant coating was oven-dried as described above. The thickness was measured approximately using a spring-loaded thickness gauge which tended to compress the highly compressible uncured film. No attempt was made to correct for the compression. The pump speed and/or line speed was adjusted, and a second thickness determined. Usually, a third setting would be made, and a third thickness determination made. On the basis of the data so obtained, a calibration curve was determined and the pump speed and/or line speed settings determined from the curve that corresponded to the desired thickness. Those settings were set, and the examples described in Table 3 produced. A different calibration curve was determined prior to each day of running on the coating line.

The nominal thickness of the coating from Feed A was determined as follows: After the thickness of the coating from Feed B was determined, as described in the previous paragraph, Feed A was introduced at some setting which by prior experience was expected to provide a thickness close to the target thickness. The coalesced coating of Feed A and Feed B was dried, and the total thickness determined using the same spring-loaded gauge, with the same compression problem. Since experience working with thin coatings showed that the slope of all calibration curves determined were parallel, only a single point was determined. Then using the calibration curve generated from that point, the pump speed for Feed A was adjusted to give the desired total thickness as determined from the calibration curve. The nominal value of the coating from Feed A shown in Table 3 is the difference determined between the calibrated value of the total thickness and the calibrated value of the thickness of the Feed B coating alone.

FIGS. 8, 9, 10, 11 are transmission electron micrographs of the dried uncured films prepared in Examples 10, 13, 17 and 18 respectively. The TEM cross-sections show the variation of silica distribution in the thickness direction. The cross-section samples were taken with the epoxy only at the so called B-stage (not fully cured). White regions in the TEM pictures represent voids where silica particles were dislodged during cross-section sample micro-toming.

TABLE 3

| | | Feed A | | Feed B | |
| --- | --- | --- | --- | --- | --- |
| Example | Line Speed (m/s) | Die slot gap (µm) | Nominal Coating Thickness (µm, dry) | Die slot gap (µm) | Nominal Coating Thickness (µm, dry) |
| 2 | 0.20 | 76 | 5 | 127 | 37 |
| 3 | 0.20 | 76 | 7 | 127 | 37 |
| 4 | 0.20 | 76 | 8 | 127 | 37 |
| 5 | 0.20 | 76 | 12 | 127 | 37 |
| 6 | 0.15 | 76 | 4 | 152 | 30 |
| 7 | 0.15 | 76 | 6 | 152 | 30 |
| 8 | 0.15 | 76 | 9 | 152 | 30 |
| 9 | 0.13 | 76 | 12 | 152 | 27 |
| 10 | 0.25 | 127 | 2.5 | 152 | 31 |
| 11 | 0.25 | 127 | 5 | 152 | 31 |
| 12 | 0.25 | 127 | 7 | 152 | 31 |
| 13 | 0.20 | 127 | 3 | 152 | 30 |
| 14 | 0.20 | 127 | 4.5 | 152 | 30 |
| 15 | 0.20 | 127 | 7 | 152 | 30 |
| 16 | 0.23 | 127 | 4.5 | 152 | 33 |
| 17 | 0.23 | 127 | 7 | 152 | 33 |
| 18 | 0.23 | 127 | 9 | 152 | 33 |
| 19 | 0.20 | 127 | 3 | 152 | 30 |
| 20 | 0.20 | 127 | 4.4 | 152 | 30 |
| 21 | 0.20 | 127 | 6.7 | 152 | 30 |
| 22 | 0.20 | 127 | 3 | 152 | 30 |
| 23 | 0.20 | 127 | 4.3 | 152 | 30 |
| 24 | 0.20 | 127 | 6.8 | 152 | 30 |
| 25 | 0.20 | 127 | 4.4 | 152 | 30 |

TABLE 3-continued

| | | Feed A | | Feed B | |
|---|---|---|---|---|---|
| Example | Line Speed (m/s) | Die slot gap (μm) | Nominal Coating Thickness (μm, dry) | Die slot gap (μm) | Nominal Coating Thickness (μm, dry) |
| 26 | 0.20 | 127 | 7.2 | 152 | 30 |
| 27 | 0.20 | 127 | 8.4 | 152 | 30 |
| 28 | 0.20 | 127 | 7 | 152 | 33 |

Preparation and Testing of Copper Peel Samples

Thermal expansion coefficient, glass transition temperature of the cured films, surface roughness of the film after desmear, and copper peel strength of plated samples are shown in Table 4.

The dried uncured films of Examples 2-28 were laminated to fiberglass/epoxy laminates, known in the industry as epoxy FR-4 cores, for support. The films were laminated with the coated film facing the FR-4 core and the PET film on the exterior. A Meiki Co. Ltd (Japan) Model MVLP500 vacuum laminator was used at 130° C. with vacuum for 30 s and at 1.0 MPa for 60 s. The PET backing was then removed and the structure cured in a convective heating oven at 170° C. for 1 hour.

The samples were then subjected to an industry standard desmear process using an alkaline permanganate oxidizing solution available from Atotech GmbH. Electroless copper deposition was applied to the surface using solution systems supplied by Atotech GmbH and the copper plating completed using standard electrolytic plating method. The peel strength between the plated copper and the cured epoxy film were measured according to Japanese Industrial Standard (JIS) C6481.

Surface roughness of the samples so treated was measured using an optical interferometer after the desmear process but before copper plating.

Preparation and Testing of Thermal Expansion Coefficient Samples

The Mylar® backing was removed from the dried uncured film samples and the films were cured in a convective oven at 170° C. for an hour. The thermal expansion coefficient (CTE) and glass transition temperature were measured using a thermomechanical analyzer according to Japanese Industrial Standard (JIS) C6481. The sample heating rate was 10° C./min.

TABLE 4

| Example | Cu Peel Strength (N/cm) | Surface Roughness, Ra (μm) | Thermal Expansion Coefficient (<Tg), ppm/° C. | Glass Transition Temperature, ° C. |
|---|---|---|---|---|
| 2 | 4.0 | 0.48 | 37 | 168 |
| 3 | 3.9 | 0.38 | 34 | 168 |
| 4 | 4.1 | 0.54 | 39 | 169 |
| 5 | 5.4 | 0.36 | 41 | 167 |
| 6 | 4.1 | 0.33 | 36 | 166 |
| 7 | 0.9 | 0.03 | 40 | 166 |
| 8 | 0.5 | 0.09 | 38 | 165 |
| 9 | 0.5 | 0.13 | 38 | 165 |
| 10 | 3.5 | 0.26 | 40 | 170 |
| 11 | 2.3 | 0.17 | 41 | 170 |
| 12 | 0.9 | 0.05 | 38 | 171 |
| 13 | 4.5 | 0.23 | 36 | 170 |
| 14 | 1.3 | 0.09 | 39 | 170 |
| 15 | 0.7 | 0.07 | 39 | 170 |
| 16 | 3.2 | 0.21 | 40 | 171 |
| 17 | 4.2 | 0.39 | 37 | 170 |
| 18 | 3.0 | 0.13 | 41 | 171 |
| 19 | 5.1 | 0.15 | 36 | 170 |
| 20 | 1.6 | 0.08 | 42 | 170 |
| 21 | 0.9 | 0.03 | 41 | 171 |
| 22 | 5.1 | 0.19 | 39 | 171 |
| 23 | 2.0 | 0.10 | 37 | 171 |
| 24 | 1.6 | 0.09 | 39 | 171 |
| 25 | 3.3 | 0.18 | 37 | 171 |
| 26 | 1.7 | 0.09 | 35 | 171 |
| 27 | 1.4 | 0.06 | 36 | 170 |
| 28 | 5.5 | 0.24 | 38 | 169 |

Example 29

A film was made using two sequential coating passes with a single slot coater. The resin formulation used was the same as in Examples 2 through 28. The average diameter of the silica particle used in the first pass coating was 40 nm, and 80 nm for the second pass coating. The compositions of the dispersions of the two passes are shown in Table 5.

TABLE 5

| | Dispersion composition, weight % | | | Weight % silica |
|---|---|---|---|---|
| | solvent | silica | resin | in dry film |
| 1st Pass | 66.4 | 3.4 | 30.2 | 10 |
| 2nd Pass | 49.5 | 27.8 | 22.7 | 55 |

For the first pass of coating, the dispersion was coated onto a moving support film of 38 micron thick poly(ethylene terephthalate) [PET]. Table 6 shows the coating parameters used. The coated film was then passed through a convective oven set at 93° C. at the entrance, dropping to 37° C. at the exit to remove the solvents. The coated film was wound up into a roll with a polyethylene film over the coated film as a release.

TABLE 6

| | Die slot gap, microns | Coating Thickness Aim (μm, dry) | Line speed, m/s | Volumetric flow rate, cc/min |
|---|---|---|---|---|
| 1st Pass | 76 | 8.4 | 0.127 | 139 |
| 2nd Pass | 127 | 38 | 0.178 | 625 |

The coated film was then re-mounted onto the coater. The release polyethylene film was removed as the film was unwound. A second dispersion was then coated onto this first pass using the coating parameters shown in Table 6.

The properties of the film, after curing, are shown in Table 7 below.

TABLE 7

| Cu Peel Strength (N/cm) | Thermal Expansion Coefficient (<Tg), ppm/° C. | Glass Transition Temperature, ° C. |
|---|---|---|
| 4.4 | 50 | 154 |

Figure 12:
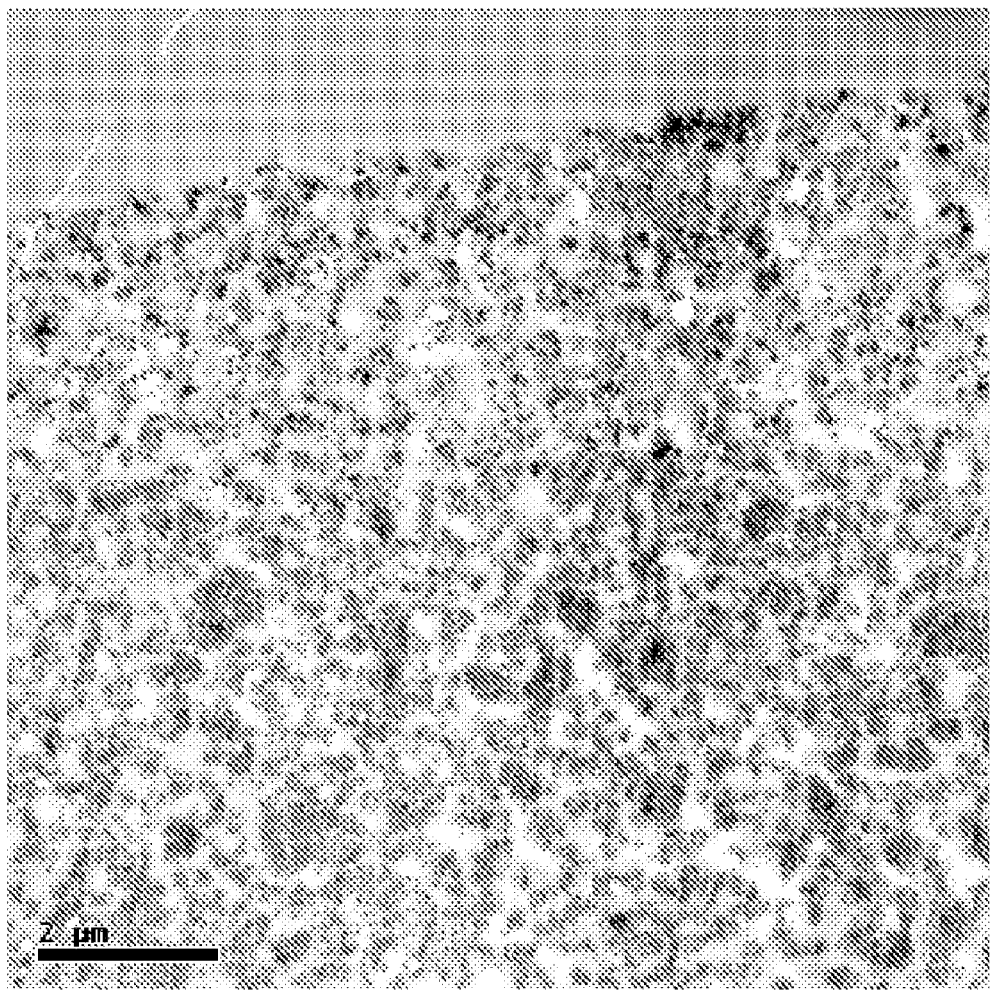
FIG. 12 shows transmission electron micrograph (TEM) results from Example 29.

FIG. 12 shows transmission electron micrograph (TEM) results from Example 29

Example 30

An uncured dielectric film was made according to Example 10. The release cover film was removed, and one piece of film (with PET backing) was placed on a ~19 μm thick electro-deposited copper foil. The copper foil was oriented so that the rough surface faced the dielectric film. This assembly was then placed between two Teflon® PFA release films. A porous fiberglass release film was placed on the top of the stack as a breather. The whole stack was then placed inside a vacuum bag consisting of a metal plate covered with a 127 mm thick Teflon® FEP film. Pressure in the bag was reduced to 336 mbar to compress the film stack. The bag was placed in a platen press (without any additional pressure on the stack) at 110° C. for 5 min. and then cooled down. The PET was removed from the dielectric film and another piece of ~19 microns thick electro-deposited copper foil was placed on the exposed surface of the dielectric film. The dielectric film was now covered on both surfaces with copper foil. The assembly was then put into the same vacuum bag arrangement and heated in the platen press at 110° C. for 5 min. and then cooled down. The copper/dielectric film/copper laminate was then removed from the vacuum bag and cured in a convective oven at 110° C. then ramped to 130° C. and held for 30 min. The oven temperature was then increased to 150° C. and held for 10 min. Lastly, the temperature was ramped to 170° C. and held for 1 hour.

Figure 13:
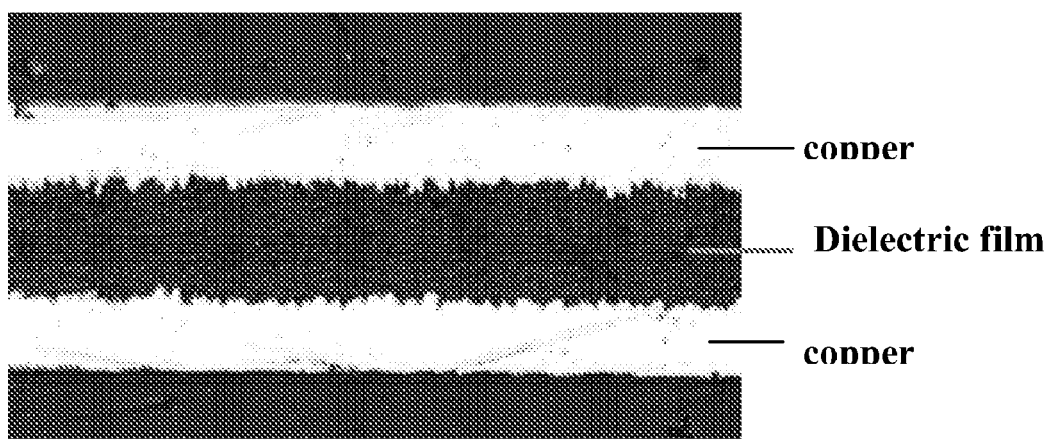
FIG. 13 shows an optical micrograph of the cross-section of the laminate produced in Example 30.

FIG. 13 is an optical cross-section of the resulting laminate.

What is claimed:

1. A multi-layer chip carrier comprising a dielectric substrate having a surface, a first electrically conductive layer adheringly disposed upon at least a portion of the surface of the dielectric substrate, and an asymmetric film having a first film surface and a second film surface, said first film surface and said second film surface parallel to one another and separated by an interior, the film comprising a thermoset resin composition with one or more fillers dispersed therewithin, the one or more fillers having a total concentration of 15% to 75% by weight based on the total combined weight of the thermoset resin composition and fillers when cured, excluding solvents and volatiles, wherein in the interior the concentration of the one or more fillers exhibits a continuous gradient, each of the fillers having an average particle size in the range of 0.01 to 5 μm; the first surface being in conforming contact with the first electrically conductive layer, and the second surface being in adhering contact with a second electrically conductive layer disposed thereon.

2. The multi-layer chip carrier of claim 1 wherein the asymmetric film further comprises a resin-rich region proximate to the first film surface.

3. The multi-layer chip carrier of claim 1 wherein the asymmetric film further comprises a filler-rich region proximate to the second film surface.

4. The multi-layer chip carrier of claim 1 wherein the asymmetric film further comprises a resin-rich region proximate to the first surface, a filler-rich region proximate to the second surface, and a transition region between the resin-rich region and the filler-rich region, wherein the concentration of the one or more fillers exhibits a continuous gradient in the transition region.

5. The multi-layer chip carrier of claim 1 wherein the asymmetric film further comprises one or more fillers exhibiting a bimodal size distribution.

6. The multi-layer chip carrier of claim 1 wherein in the asymmetric film the thermoset resin comprises an aromatic multifunctional epoxy.

7. The multi-layer chip carrier of claim 1 wherein the second electrically conductive layer comprises a plurality of discrete conductive pathways.

8. The multi-layer chip carrier of claim 7 further comprising an integrated circuit disposed in electrically conductive contact with at least a portion of the discrete conductive pathways.

\* \* \* \* \*